United States Patent [19]
Warren

[11] Patent Number: 5,742,617
[45] Date of Patent: Apr. 21, 1998

[54] CONTROLLER FOR IMPLEMENTING SCAN TESTING

[75] Inventor: Robert Warren, Bristol, United Kingdom

[73] Assignee: SGS-Thomson Microelectronics Limited, Almondsbury Bristol, United Kingdom

[21] Appl. No.: 518,767

[22] Filed: Aug. 24, 1995

[30] Foreign Application Priority Data

Sep. 1, 1994 [GB] United Kingdom ............... 9417602

[51] Int. Cl.$^6$ ........................................... G01R 31/28
[52] U.S. Cl. ................................ 371/22.31; 371/22.32
[58] Field of Search ........................... 371/22.3, 22.5, 371/22.4, 25.1, 22.6, 22.31, 22.32, 22.34, 22.36, 27.5; 324/158 R, 158.1, 765; 395/183.01, 183.06; 364/489, 580; 327/90

[56] References Cited

U.S. PATENT DOCUMENTS

| | | | |
|---|---|---|---|
| 5,109,190 | 4/1992 | Sakashita et al. | 324/158 R |
| 5,260,947 | 11/1993 | Posse | 371/22.3 |
| 5,329,533 | 7/1994 | Lin | 371/22.3 |
| 5,396,170 | 3/1995 | D'Souza et al. | 324/158 R |
| 5,396,498 | 3/1995 | Lestrat et al. | 371/3 |
| 5,396,501 | 3/1995 | Sengoku | 371/22.3 |
| 5,422,891 | 6/1995 | Bushnell et al. | 371/22.4 |
| 5,477,493 | 12/1995 | Danbayashi | 365/201 |
| 5,546,406 | 8/1996 | Gillenwater et al. | 371/22.5 |
| 5,583,787 | 12/1996 | Underwood et al. | 364/489 |
| 5,596,584 | 1/1997 | Warren | 371/22.3 |

FOREIGN PATENT DOCUMENTS

A-0 402 134  12/1990  European Pat. Off. ........ G01R 31/28
A-0 548 585   6/1993  European Pat. Off.

OTHER PUBLICATIONS

European Search Report, from European Patent Application 95305859, dated Jan. 19, 1996.
AT&T Technical Journal, vol. 73, No. 2, Mar. 1994, New York, USA pp. 30–39, V.D. Agrawal, et al., "Built–In Self–Test for Digital Integrated Circuits".
Proceedings of the IEEE 1992 Custom Integrated Circuits Conference, May 3, 1992, Boston, MA USA pp. 13.2.1–13.2.4, H. Chang et al. "Delay Test Techniques for Boundary Scan Based Architectures".

Primary Examiner—Robert W. Beausoliel, Jr.
Assistant Examiner—Nadeem Iqbal
Attorney, Agent, or Firm—Wolf, Greenfield & Sacks, P.C.; James H. Morris

[57] ABSTRACT

A test access port controller is provided for implementing scan testing with a chain of scan latches on an integrated circuit. The test access port controller can implement a structural test or a performance test. Selection between the two types of test is achieved through logic circuitry of the test access port controller. An integrated circuit and a test system are also provided.

12 Claims, 17 Drawing Sheets

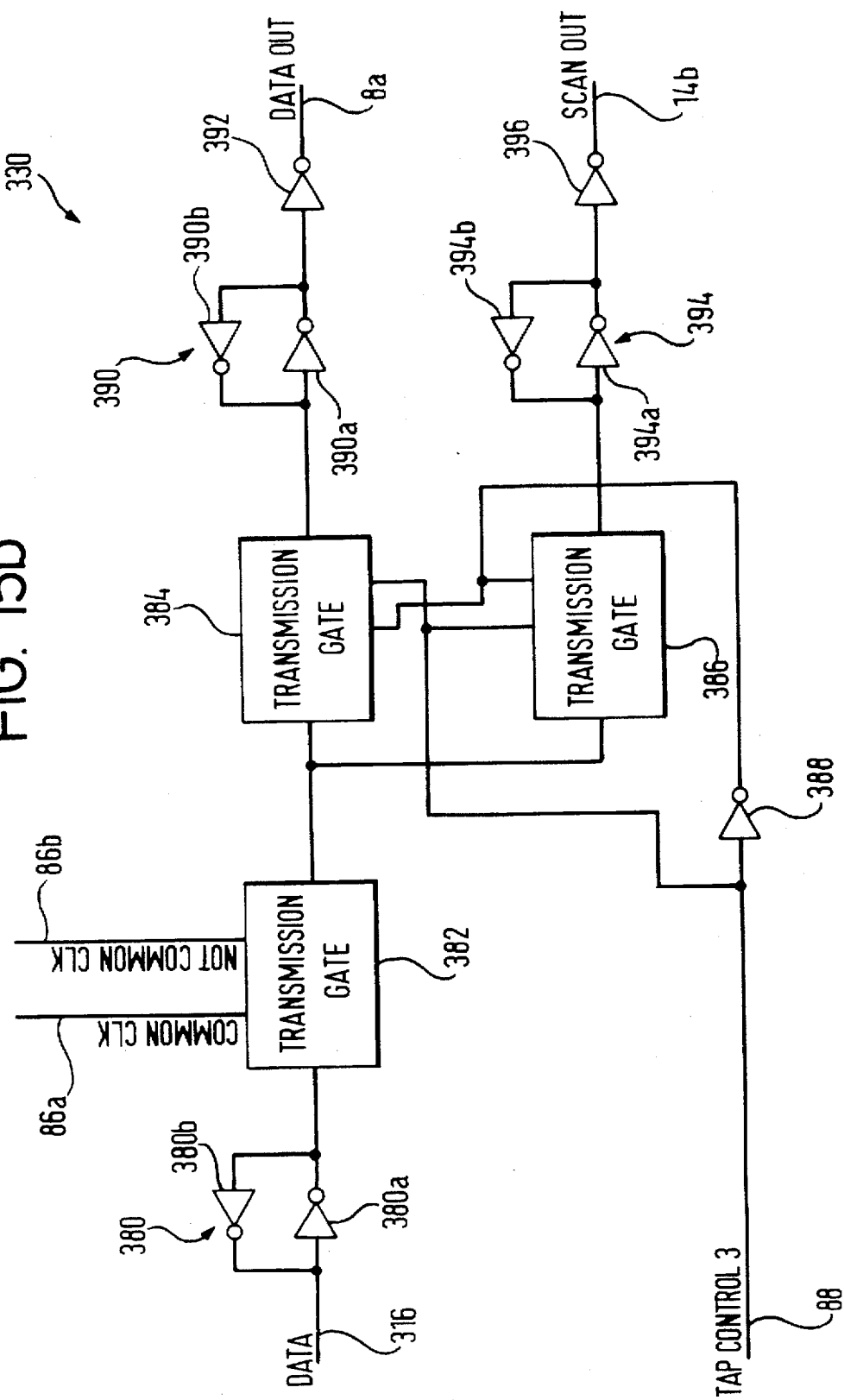

CONTROLLER FOR IMPLEMENTING SCAN TESTING

FIELD OF THE INVENTION

The present invention relates to a controller for implementing scan testing and particularly to a test access port (TAP) controller for implementing scan testing with a chain of scan latches.

BACKGROUND OF THE INVENTION

Boundary scan testing is a well established technique for checking the functionality of logic circuits in the interconnections of integrated circuits. A brief explanation of the technique follows by way of background to the present invention.

FIG. 1 illustrates schematically an exemplary structure of an integrated circuit (IC) 2 including the basic elements required to perform boundary scan testing. The IC 2 contains functional logic circuitry 4, a plurality of boundary scan cells 6a,6b,6c,6d, and a test access port (TAP) controller 12. For normal functional operation of the IC 2 the functional logic circuitry 4 is linked to the boundary scan cells 6a to 6d via respective links 10a to 10d. The boundary scan cells 6a to 6d are also connected to respective external pin connections 8a,8b,8c,8d which allow the functional logic circuitry to be connected to other circuitry including other ICs. For the purpose of performing boundary scan testing the boundary scan cells 6a to 6d each additionally include a scan test circuit, the scan test circuits being connected in a chain via chain connections 14a,14b,14c,14d,14e, the chain beginning and ending at the TAP controller 12.

The boundary scan cells 6a to 6d are only provided for the purpose of performing boundary scan testing. In normal functional operation of the IC 2 the boundary scan cells 6a to 6d operate to provide a direct connection between the links 10a to 10d and the external pin connections 8a to 8d.

Therefore, as normal function mode is always entered upon reset of the TAP controller, the links 10a to 10d will always be connected directly to the external pin connections 8a to 8d upon reset.

A simple boundary scan test is intended to check integrity between each external pin connection 8a to 8d and a corresponding external pin connection on another IC. A simple implementation of a known boundary scan cell for use in a boundary scan test circuit capable of implementing this is illustrated in FIG. 2. Such a boundary scan cell is known from IEEE Standard 1149.1-1990. The boundary scan cells 6a to 6d can be constructed to operate such that signals can only be inputted to the functional logic circuitry 4, such that signals can only be outputted from the functional logic circuitry 4, or such that signals can be both inputted to and outputted from the functional logic circuitry 4. The following description considers the implementation where the boundary scan cells 6a to 6d can all only output signals from the functional logic circuitry 4.

The boundary scan cell of FIG. 2 comprises an input multiplexor 26a, an output multiplexor 18a and two latches 28a,40a. The input multiplexor 26a has as one of its inputs the signal DATAIN on line 10a and as its other input the signal SCANIN on line 14a. The input multiplexor is controlled by a signal TAPCONTROL1 on line 34. The output of the input multiplexor 26a on line 30a forms the input to the capture latch 28a, and the output of the latch 28a on line 16a forms the input to the update latch 40a on line 22a and the signal SCANOUT on line 14b. The latches 28a and 40a are respectively clocked by the signals TAPCLOCK1 and TAPCLOCK2 on lines 36 and 38 respectively. The output multiplexor 18a has as one of its inputs the signal DATAIN on line 10a and as its other input the output of the latch 40a on line 24a. The output multiplexor is controlled by a signal TAPCONTROL2 on line 22 and generates at its output the signal DATAOUT on line 8a. The signals TAPCONTROL1, TAPCONTROL2, TAPCLOCK1 and TAPCLOCK2 are all generated under the control of the TAP controller 12 and are all common to all the boundary scan cells 6a to 6d, although these signals and connections are not shown in FIG. 1 for reasons of clarity.

Two modes of operation of the IC 2 of FIG. 1 will now be described with reference to FIGS. 1 and 2. It will be appreciated that each of the boundary scan cells 6a to 6d contains a circuit similar to that shown in FIG. 2, with the various components and signal lines suffixed b,c,d appropriately.

In normal functional operation, the TAP controller 12 is inactive and the output multiplexor 18a will be controlled by the control signal TAPCONTROL2 on line 22 such that the signal DATAIN on line 10a is connected directly to the signal DATAOUT on line 8a. During such normal functional operation the control of the input multiplexor 26a is unimportant, and the clock signals TAPCLOCK1 and TAPCLOCK2 on lines 36 and 38 respectively will both preferably be inhibited.

When a boundary scan test is to be performed, the TAP controller 12 on IC2 controls the signal TAPCONTROL2 on line 22 such that the multiplexor 18a connects its input on line 24a from the output of the latch 40a to its output on line 8a. In order to carry out the boundary scan test it is necessary to place a known bit on each of the respective pin connections 8a to 8d. To achieve this the TAP controller controls the multiplexor 26a by means of the control signal TAPCONTROL1 on line 34 such that its output on line 30a is connected to its input on line 14a. The TAP controller 12 then serially outputs a sequence of test bits on line 14a under the control of the clock signal TAPCLOCK1 on line 36 such that the test bits are clocked through the latches 28a to 28d in sequence via the signal lines 14b to 14d. After a plurality of clock cycles (four in the example shown in FIG. 1 but normally a much larger number dependent on the number and type of pin connections 8a to 8d) of TAPCLOCK1 each of the nodes 31a to 31d will have a known test bit stored thereat by means of the respective latches 28a to 28d. The TAP controller then clocks the signal TAPCLOCK2 on line 38 such that the test bit on each node 31a to 31d appears on output lines 24a to 24d of latches 40a to 40d. Consequently the test bits appear on the respective external pin connections 8a to 8d. If the IC 2 is connected to similar boundary scan cells being configured to input signals to their respective IC and having a boundary scan test capability, then the TAP controllers controlling these input boundary scan cells can serially read their respective boundary scan cells so that a check can be carried out to ensure that the value written to a boundary scan cell by a particular TAP controller was successfully communicated to another boundary scan cell to which it is connected. In this manner the interconnections between various ICs can be tested.

It can be seen that the above technique allows the test to be carried out without the TAP controller 12 needing to account for the actual operation of the functional logic circuitry 4. The TAP controller only needs to know the number and type of boundary scan cells on the IC 2. The boundary scan testing technique is primarily intended for board testing.

FIG. 3 illustrates the state diagram of the TAP controller 12 of FIG. 1 as defined by IEEE Standard 1149.1-1990. The operation of the circuitry of FIG. 2 in performing a boundary scan test will now be described with the aid of the state diagram shown in FIG. 3.

During normal functional operation of the IC 2 the TAP controller 12 is in a test-logic-reset state S0. In this state the test logic is idle and the signal DATAIN on line 10a is connected directly to the signal DATAOUT on line 8a by means of the output multiplexor 18a under control of the signal TAPCONTROL2 on line 22. The TAP controller 12 is controlled by a master clock signal MCLOCK. The master clock MCLOCK is a buffered version of the clock TCK defined in IEEE Standard 1149.1-1990. Upon a test operation commencing, the TAP controller 12 will first move into a run-test/idle state S1.

If a boundary scan test is to be carried out the TAP controller 12 will, on the next cycle of MCLOCK, enter a select-scan state S2 and the control signal TAPCONTROL2 on line 22 will change state such that the output signal DATAOUT of the output multiplexor 18a on line 8a is connected directly to the signal on line 24a. On the next clock cycle of MCLOCK the TAP controller will enter a capture state S3. At this stage of the test the capture state is unimportant because no test data has yet been loaded into the scan test circuit.

On the next clock cycle of MCLOCK a shift state S4 is entered into. In this state the TAP controller produces a plurality of clock cycles constituting clock signal TAPCLOCK1 on line 36 whilst holding the signal TAPCONTROL1 on line 34 at a level such that the signal SCANIN on line 14a appears at the output 30a of the multiplexor 26a. In this way the test data is serially shifted into the test circuitry such that after a certain number n of clock cycles of TAPCLOCK1 (in this case four) the latches 28a,28b,28c, 28d all have a known test bit on their respective outputs on nodes 31a to 31d. Hence for n cycles of the master clock MCLOCK the shift state S4 is retained. On the next cycle of the master clock an exit1 state S5 is entered. The state S5 is a temporary state and the TAP controller will normally move into an update state S8 on the next clock cycle of the master clock. The TAP controller could alternatively enter a pause state S6 followed by an exit2 state S7, but for reasons unconcerned with this invention and which are not explained herein.

Whilst in the update state S8 the TAP controller causes the output of the latch 40a to be updated by generating a clock cycle to constitute clocking the clock signal TAPCLOCK2 on line 38a once. The test data bit on the output node 31a of the latch 28a will therefore appear on the output of the latch 40a on the line 24a and consequently as the DATAOUT signal on line 8a. At this point of the test operation all the DATAOUT signals on lines 8a to 8d will have been updated. The pin connections 8a to 8d are, as mentioned previously, connected to respective pin connections on one or more other ICs. Therefore, after a short amount of time to allow for the propagation of the updated signal between the ICs (which may include propagation through buffering logic between the ICs), the updated signals on pin connections 8a to 8d will appear on the respective pin connections on one or more other ICs. The pin connections on the other ICs will be connected to boundary scan cells configured as input or input/output devices. It will be within the scope of a skilled person having reference to IEEE Standard 1149.1-1990 how such an input boundary scan cell will be implemented and such an input boundary scan cell will therefore not be described in detail herein. For the purposes of completing the description of a boundary scan test it will be assumed that the input boundary scan cell on the IC to which the IC 2 is connected is identical to the boundary scan cell of FIG. 2, with the difference that the pin connection of such other IC is connected as the DATAIN signal on line 10a. Therefore, for the purposes of the remainder of the description of the circuit of FIG. 2, it is assumed that the signal DATAIN on line 10a is a result to be checked. In other words, it will be assumed that after the previously described update operation is performed, a short time afterwards a result will be generated on line 10a.

On the next cycle of the master clock the TAP controller will once again enter the select scan state S2 and then on the next cycle will enter the capture state S3. In the capture state the latch 28a will be clocked once by the clock signal TAPCLOCK1 on line 36 whilst the multiplexor is controlled by the signal TAPCONTROL1 on line 34 such that the signal on line 10a appears on its output on line 30a. Thus the result generated in response to the update operation is captured on line 16a. The TAP controller then, on the next master clock cycle, enters the shift state S4 once more and the results captured on the outputs of the flip-flops 28a to 28d are serially clocked out to the TAP controller, under the control of clock signal TAPCLOCK1 on line 36. It can be appreciated that at the same time as the captured result is clocked out of the latches 28a to 28d a new set of test bits can be clocked into the latches 28a to 28d from the TAP controller. Consequently, the above described cycle of states from S2,S3,S4,S5,S8 and back to S2 can be repeated continuously.

Referring now to FIG. 4, an implementation of the latch 28a of FIG. 2 is shown. The latch 28a consists of two half-latches, or transparent latches, 44a and 46a. Each half-latch consists of a respective control node 48a,52a and a respective storage node 50a,54a. The clock signal TAPCLOCK1 on line 36 clocks the control node 52a of half-latch 46a whilst the inverse of the clock signal TAPCLOCK1, NOTTAPCLOCK1, clocks the control node 48a. It will be understood, as is well known in the art, that the clock signals TAPCLOCK1 and NOTTAPCLOCK1 could be non-overlapping clock signals, or alternatively circuitry in the control nodes 48a and 52a could take account of any possible overlap of the two clocks. The latch 40a of FIG. 2 similarly comprises two half-latches. It can therefore be seen that the circuit of FIG. 2 comprises four half-latches. To provide correct clock operation for both normal functional operation and for test purposes, the circuit of FIG. 2 requires a complex clocking scheme as will be understood from the description provided hereinabove with reference to FIGS. 2 and 3.

The scan latch of FIG. 4 can be used to carry out so-called "structural" tests to test the structure of combinational logic. However, it has not been possible hithertofore to carry out a so-called "performance test" to test the timing path of logic circuitry.

One object of the present invention is to provide a controller for scan testing which can allow the implementation of a structural test or a performance test with minimal changes to the controller itself.

SUMMARY OF THE INVENTION

According to the present invention there is provided a test access port controller for implementing scan testing with a chain of scan latches comprising: logic circuitry for generating a plurality of control signals to said scan latches; a data output for outputting test data to said scan latches; a data input for receiving resultant data from said scan latches, whereby said resultant data can be compared with expected data; a signal generator for outputting timing signals to said scan latches; a state indicator connected to said logic circuitry and to said signal generator for selecting a mode of operation of said controller from a first mode of structural test which provides resultant data dependent on a predetermined extant set of test data and a second mode of performance test which provides resultant data dependent on a change from a first set of test data to a second set of test data within a controllable time period.

In the preferred embodiment, the logic circuitry comprises first and second logic gates for outputting respectively control signals for implementing a structural and a performance test, said state indicator being operable to select the appropriate one of said first and second sets of logic gates.

In that case, a multiplexor can be connected to the outputs of the first and second logic gates, the state indicator controlling the state of the multiplexor.

The logic circuitry can comprise a programmable logic array, the configuration of which can be set in response to a signal from said state indicator.

In a particularly advantageous embodiment, the state indicator can be provided by a control bit held in an instruction register of the controller. Alternatively, the state indicator can comprise a code stored in the instruction register.

The controller can comprise a state machine for sequentially cycling through a plurality of states and including state logic for defining each state and a state register for controlling said cycling and for outputting state commands to said logic circuitry, wherein the definition of each state depends on a signal from said state indicator.

The signal generator can be capable of generating two signals defining said controllable time period when said performance test is selected.

For a better understanding of the present invention and to show how the same may be carried into effect, reference will now be made by way of example to FIGS. 5 to 15 of the accompanying drawings.

BRIEF DESCRIPTION OF THE DRAWINGS

FIGS. 15a and 15b illustrate the circuit details of the schematic of FIG. 14;

DESCRIPTION OF THE PREFERRED EMBODIMENT

Figure 1:
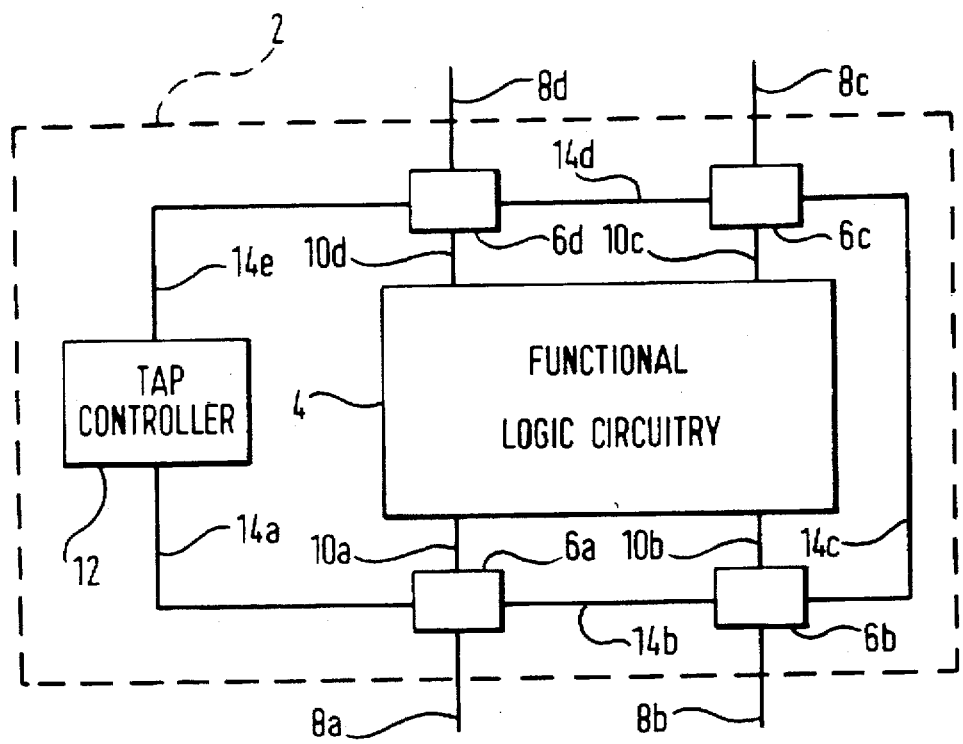
FIG. 1 is a block diagram of an integrated circuit capable of implementing boundary scan testing.
Figure 2:
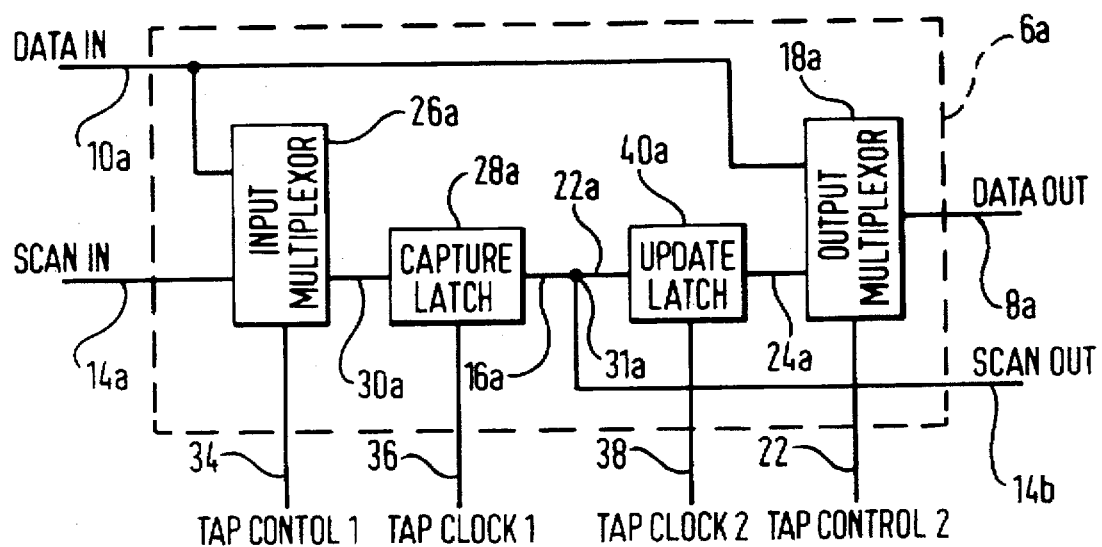
FIG. 2 is a block diagram of a known boundary scan cell for use in a boundary test circuit.
Figure 5:
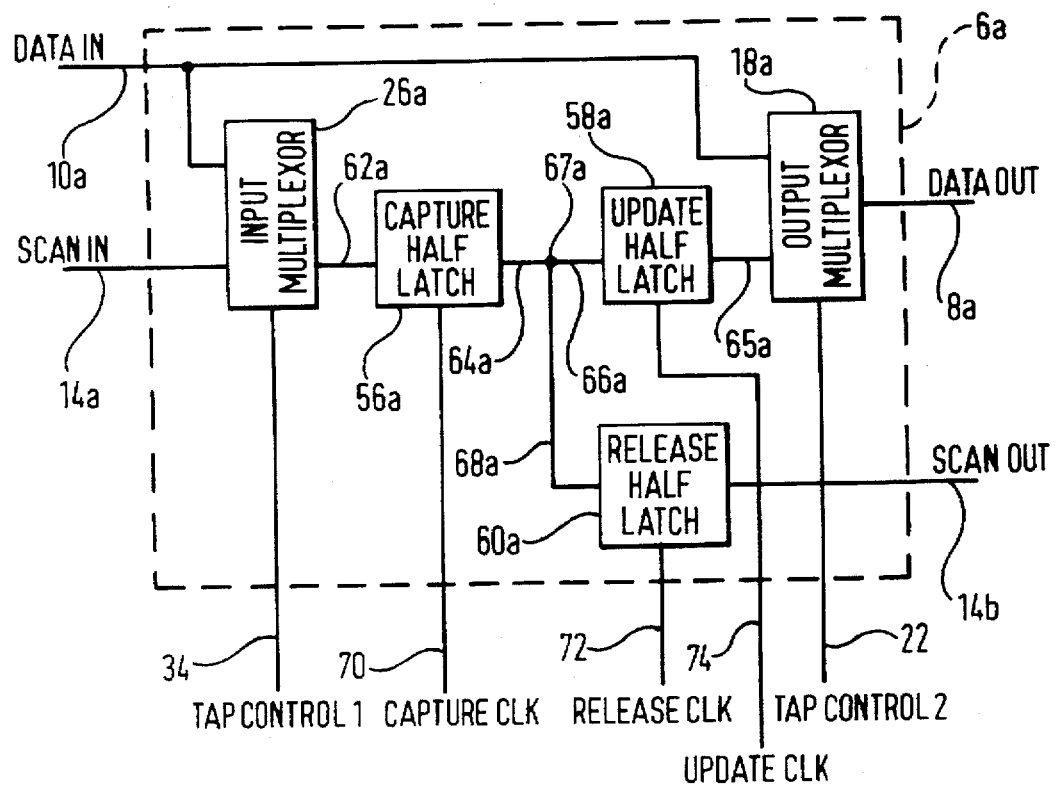
FIG. 5 is a circuit diagram of a boundary scan cell in accordance with one embodiment of the invention.

Reference is first made to FIG. 5 which illustrates a more efficient implementation of the test circuitry shown in FIG. 2 according to one aspect of the present invention. Reference numerals are the same as for like parts in FIGS. 1 to 4. In FIG. 5, the two full latches 28a,40a of FIG. 2 have been replaced by three half-latches, a capture half-latch 56a, an update half-latch 58a and a release half-latch 60a. The output of the multiplexor 26a on line 62 is connected to the input of the capture half-latch 56a. The output of the capture half-latch 56a on line 64a is connected to an input line 66a of the update half-latch 58a and an input line 68a of the release half-latch 60a. The output of the update half-latch 58a on line 65a forms an input to the output multiplexor 18a. The output of the release half-latch 60a forms the chain connection 14b. The capture half-latch 56a is clocked by the clock signal CAPTURECLK on line 70, the update half-latch is clocked by the clock signal UPDATECLK on line 74, and the release half-latch is clocked by the clock signal RELEASECLK on line 72. Each half-latch has the property that it can be in one of two states, a data transfer state in which a signal on its input is transmitted directly to its output, or a data holding state in which a signal is held on its output node regardless of changes at the input. References in the following to "clocking" of half-latches refer to operations of the data transfer state. It is assumed that, unless "clocked", the half-latch is in the data retention state.

Referring back to the state diagram of FIG. 3, the same sequence of state changes discussed with reference to FIGS. 2 and 3 can be used to operate the circuit of FIG. 5 to carry out a boundary scan test. The difference lies in the clocking sequences required which are much simpler with the present invention. This will now be described with reference to FIGS. 3 and 5.

During normal functional operation of the IC 2 the TAP controller 12 is in the test-logic-reset state S0. In this state the test logic is idle and the signal DATAIN on line 10a is connected directly to the signal DATAOUT on line 8a by means of the output multiplexor 18a under control of the signal TAPCONTROL2 on line 22. Upon a test operation commencing, the TAP controller 12 will first move into the run-test/idle state S1 under the control of the master clock MCLOCK.

If a boundary scan test is to be carried out the TAP controller 12 will enter the select-scan state S2 and the control signal TAPCONTROL2 on line 22 will change state such that the output signal DATAOUT of the output multiplexor 18a on line 8a is connected directly to the signal on line 65a. On the next clock cycle of MCLOCK the TAP controller will enter the capture state S3. At this stage of the test the capture state is unimportant because no test data has yet been loaded into the scan test circuit.

On the next clock cycle of MCLOCK the shift state S4 is entered into. In this state the TAP controller produces a plurality of clock cycles constituting the clock signal CAPTURECLK on line 70 and the clock signal RELEASECLK on line 72 whilst holding the signal TAPCONTROL1 on line 34 at a level such that the signal on line 14a appears at the output 62a of the multiplexor 26a. In this way the test data is serially shifted into the test circuitry such that after a certain number n of clock cycles of the clock signals CAPTURECLK and RELEASECLK (in this case four) the half latches 56a to 56d all have a known test bit retained on their respective outputs on nodes 67a to 67d. Hence for n cycles of the master clock MCLOCK the shift state S4 is retained. On the next cycle of the master clock the exit1 state S5 is entered. The state S5 is a temporary state and the TAP controller will normally move into the update state S8 on the next clock cycle of the master clock. The TAP controller could alternatively enter the pause state S6 followed by an exit2 state S7, but for reasons unconcerned with this invention and which are not explained herein.

Whilst in the update state S8 the TAP controller causes the output of the half-latch 58a to be updated by generating a clock cycle to constitute clocking the clock signal UPDATECLK on line 74 once. The test data bit on the output node 67a of the capture half latch 56a will therefore appear on the output of the update half-latch 58a on the line 65a and consequently as the DATAOUT signal on line 8a. At this point of the test operation all the DATAOUT signals on lines 8a to 8d will have been updated. The pin connections 8a to 8d are, as mentioned previously, connected to respective pin connections on one or more other ICs. Therefore, after a short amount of time to allow for the propagation of the updated signal between the ICs (which may include propagation through buffering logic between the ICs), the updated signals on pin connections 8a to 8d will appear on the respective pin connection on one or more other ICs. The pin connections on the other ICs will be connected to boundary scan cells configured as input or input/output devices. It will be within the scope of a skilled person having reference to IEEE Standard 1149.1-1990 how such input boundary scan cell will be implemented and such input boundary scan cell will not be described in detail herein. For the purposes of completing the description of a boundary scan test it will be assumed that the input boundary scan cell on the IC to which IC2 is connected is identical to the boundary scan cell of FIG. 5, with the difference that the pin connection is connected as the DATAIN signal on line 10a. Therefore, for the purposes of the remainder of the description of the circuit of FIG. 5, it is assumed that the signal DATAIN on line 10a is a result to be checked, the result being generated in response to the update previously described.

On the next cycle of the master clock the TAP controller will once again enter the select scan state S2 and then on the next cycle will enter the capture state S3. In the capture state the capture half-latch 56a will be clocked once by the signal CAPTURECLK on line 70 whilst the multiplexor 26a is controlled by the signal TAPCONTROL1 on line 34 such that the DATAIN signal on line 10a appears on its output on line 62a. Thus the result is captured on line 64a. The TAP controller then on the next master clock cycle enters the shift state S4 once more and the results captured on the outputs of the capture half-latches 56a to 56d are serially clocked out to the TAP controller. It can be appreciated that at the same time as the captured result is clocked out of the capture half-latch 56a a new set of test bits can be clocked into the capture half-latch 56a from the TAP controller. Consequently, the above described cycle of states from S2,S3,S4,S5,S8 and back to S2 can be repeated continuously.

The functional logic circuitry 4 of FIG. 1 can be considered to consist of various blocks of combinational logic circuitry of various sizes either interconnected directly or interconnected via latches. It is possible to test the functional aspects of the combinational logic circuitry by playing known test bits on the inputs of the combinational logic circuitry in the functional logic circuitry and capturing the result on the output of the latches in the combinational logic circuitry. This can be achieved by placing boundary scan cells such as that shown in FIG. 2 or FIG. 5 at the various test points in the functional logic circuitry. However, the boundary scan chain will then have combinational logic and latches between successive boundary scan cells, and these additional latches will cause timing problems during test operations. This problem can be overcome, however, by replacing any functional latch within the functional logic circuitry with the scan latch (i.e. the combination of input multiplexor 26a, and half-latches 56a and 58a) of the boundary scan cell 6a of FIG. 5. The latch therefore will operate as a normal functional latch during normal functional mode, and as a scan latch during scan testing. The boundary scan cell 6a of FIG. 5 may also be used in scan testing of the combinational logic circuitry to provide additional observable and controllable nodes.

Figure 6:
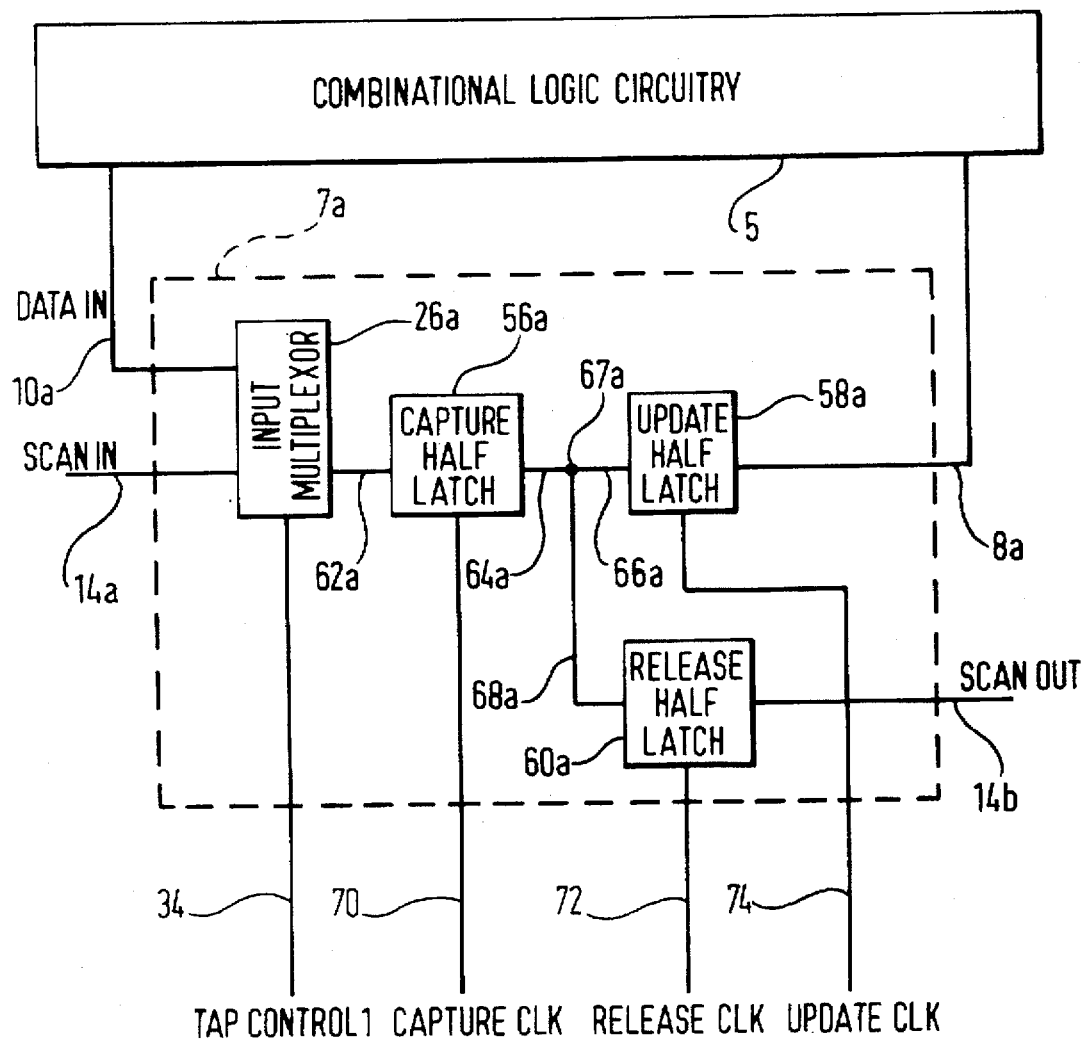
FIG. 6 is a circuit diagram of a scan cell in accordance with another embodiment of the invention.

FIG. 6 illustrates the boundary scan cell 6a of FIG. 5 reconfigured as a scan cell 7a to be used in a scan chain which tests combinational logic circuitry. The operation of the scan cell 7a of FIG. 6 in performing a test of the structure of the combinational logic will now be described with reference to the timing diagram of FIG. 7.

At the beginning of the clock cycle MCLOCK0 of the master clock MCLOCK, the TAP controller is in the reset state S0. At the end of the clock cycle MCLOCK0, a signal ACTIVATETEST goes high so that in the next clock cycle MCLOCK1 of the master clock the TAP controller 12 will enter a run-test-idle state S1 and then on the following clock cycle MCLOCK2 enter a select-scan state S2. At the beginning of the clock cycle MCLOCK3, a capture state S3 is entered and a test clock enable signal TESTCLKEN is set high. This allows the capture clock CAPTURECLK on line 70 to commence running. At the beginning of clock cycle MCLOCK4, a data output bit DOB1 will be present on the data input 10a, which may be the result output from a previous test. At the beginning of clock cycle MCLOCK4, as the TAP controller moves from state S3 into a shift state S4, the capture operation is performed as described hereinafter.

Figure 7:
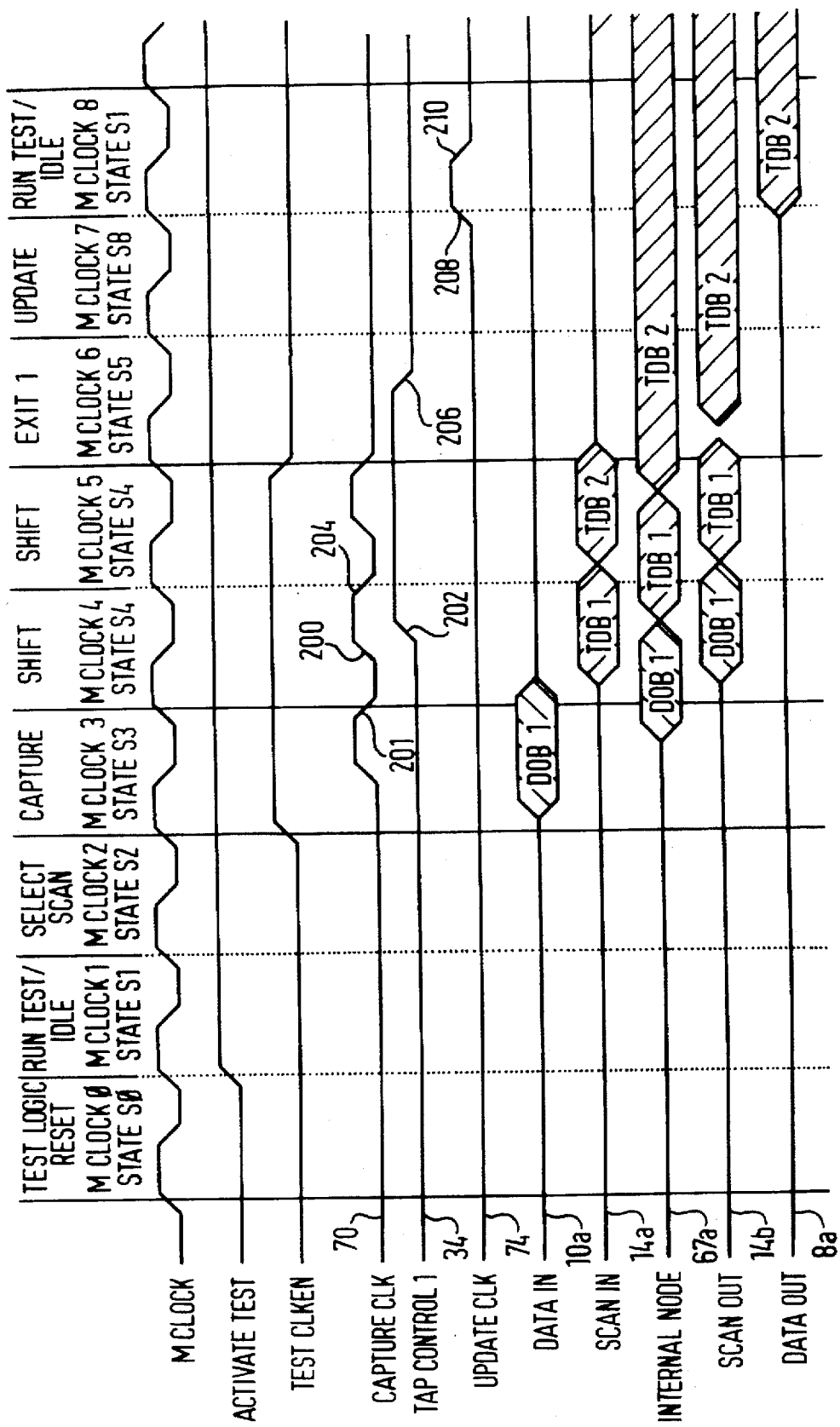
FIG. 7 is a timing diagram for the scan cell of FIG. 6 carrying out a structural test.

Referring to FIG. 7, the falling edge 201 of the capture clock signal CAPTURECLK at the beginning of clock cycle MCLOCK4 causes the data output bit DOB1 to be latched on the output node 67a of the half-latch 56a. During this operation the multiplexor 26a is controlled by the control signal TAPCONTROL1 such that its output on line 62a is connected as the DATAIN signal on line 10a. During the clock cycle MCLOCK4, the TAP controller is in the shift state S4. During the second half of the clock cycle MCLOCK4 the release clock signal RELEASECLK (not shown in FIG. 7) is provided to the release half-latch 60a such that the data output bit DOB1 at node 67a appears as the SCANOUT signal on line 14b.

Once in the shift state S4, test data bits will appear as the SCANIN signal on line 14a, the first of which is represented by the bit TDB1 being placed on line 14a shortly after the start of clock cycle MCLOCK4. On the rising edge 200 of the CAPTURECLK signal in clock cycle MCLOCK4 the capture half-latch 56 adopts its data transfer state. A short time after this the signal TAPCONTROL1 on line 34 changes state as illustrated by edge 202 such that the multiplexor 26a will connect its output on line 62a to its input on the SCANIN signal line 14a. Hence the test data bit TDB1 will appear on the internal node 67a. On the falling edge 204 of the capture clock CAPTURECLK at the beginning of the next cycle MCLOCK5 the TAP controller will, in this example, remain in the shift state S4 to enable a second test data bit TDB2 to be scanned in. A short time after the beginning of clock cycle MCLOCK5 the release clock RELEASECLK on line 72 will clock the half-latch 60a such that the first test data bit TDB1 appears as the SCANOUT signal line 14b. It will be clear that the TAP controller could thus remain in the shift state S4 for as many clock cycles of the TAP controller as required to shift in all the necessary test data bits.

In this example only two test data bits are clocked in and the second test data bit TDB2 is placed on the scan in line and shifted into the circuit during clock cycle MCLOCK5 in the same way that the test data bit TDB1 was shifted in during clock cycle MCLOCK4 as before described.

At the beginning of clock cycle MCLOCK6, the TAP controller enters an EXIT1 state S5 and the capture clock goes low and remains low such that the capture half-latch 56a remains in the data holding state and the test data bit TDB2 remains on the internal node 67a. A short time after the beginning of cycle MCLOCK6 the clock signal RELEASECLK clocks the release half-latch 60a such that the test data bit TDB2 also appears as the SCANOUT signal on line 14b. During MCLOCK6, the control signal TAPCONTROL1 on line 34 also changes state on edge 206 such that the multiplexor 26a connects its output on line 62a to its input on line 10a again.

At the beginning of clock cycle MCLOCK7, the TAP controller enters an update state S8. At the end of the clock cycle MCLOCK7 during which the TAP controller is in the update state S8, the TAP controller will latch the test data bit TDB2 on the internal node 67a onto the line 8a as the signal DATAOUT by generating edges 208 and 210 of the clock signal UPDATECLK on line 74, thus placing the half-latch 58a in a data transfer state, and then in a data holding state so that the signal line 8a has the test data bit TDB2 latched on it. The latching of the test data bit TDB2 occurs on edge 210 during clock cycle MCLOCK8 after the TAP controller has entered the run-test-idle state S1 again. It can be seen that if the same sequence of operations is performed again, the next capture operation will capture the data outputted on the line 10a as the signal DATAIN, which is the logical result of the test data bit TDB2 (and similar test data bits from other scan latches) being inputted to the combinational logic circuitry 5.

During normal functional operation data on line 10a from the combinational logic circuitry passes to the DATAOUT signal line 8a by clocking the capture half-latch with clock signal CAPTURECLK on line 70 followed by clocking the update half-latch 58 with clock signal UPDATECLK on line 74.

It can readily be seen that to perform any particular function, the capture half-latch 56a is combined with either the update half-latch 58a or the release half-latch 60a to operate as a full latch. It should be noted that during a shift operation (scan in or scan out) the update half-latch 58a is held in a data holding state so that its output does not change. It can therefore be seen that the invention has provided a scan test circuit requiring less hardware but which can be used to implement boundary scan testing according to the state sequence specified by IEEE Standard 1149.1-1990, and with the functional data output unchanging during a shift operation. Moreover, the sequence of clock signals required is simpler than that in the prior art.

The circuit of FIG. 6 provides another advantage over the prior art circuit of FIG. 2 in allowing a so-called, "performance test" to be carried out. A structural test is limited to determining the logical correctness of an output for a particular extant set of inputs. It is also desirable to test the timing aspects of the combinational logic in the functional logic circuitry 4. The performance test enables the performance of the structure of the combinational logic (rather than the performance of the logic function) to be tested. In order to carry out a performance test it is necessary to sensitise the inputs of the combinational logic with one set of sensitise bits and allow the output of the combinational logic to settle. The inputs are then changed to a set of activation bits. The time taken for the output to change from the value set in response to the sensitise input to the value set in response to the activation input is a measure of the performance of a circuit. There follows a description of how such a test can be carried out using the circuit of FIG. 6 in accordance with the present invention.

Figure 3:
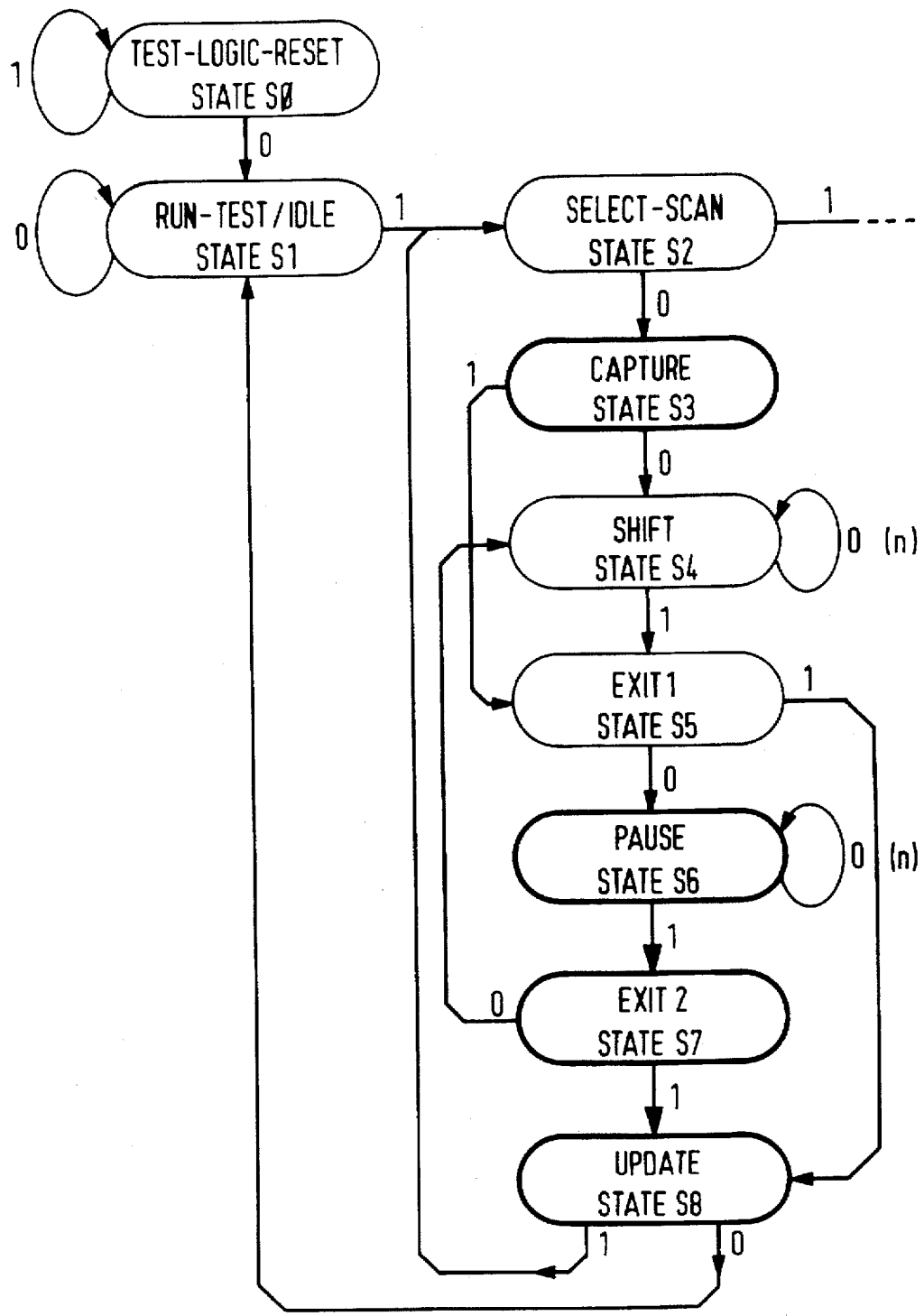
FIG. 3 is a partial state diagram for a test access port controller for carrying out a structural test.
Figure 4:
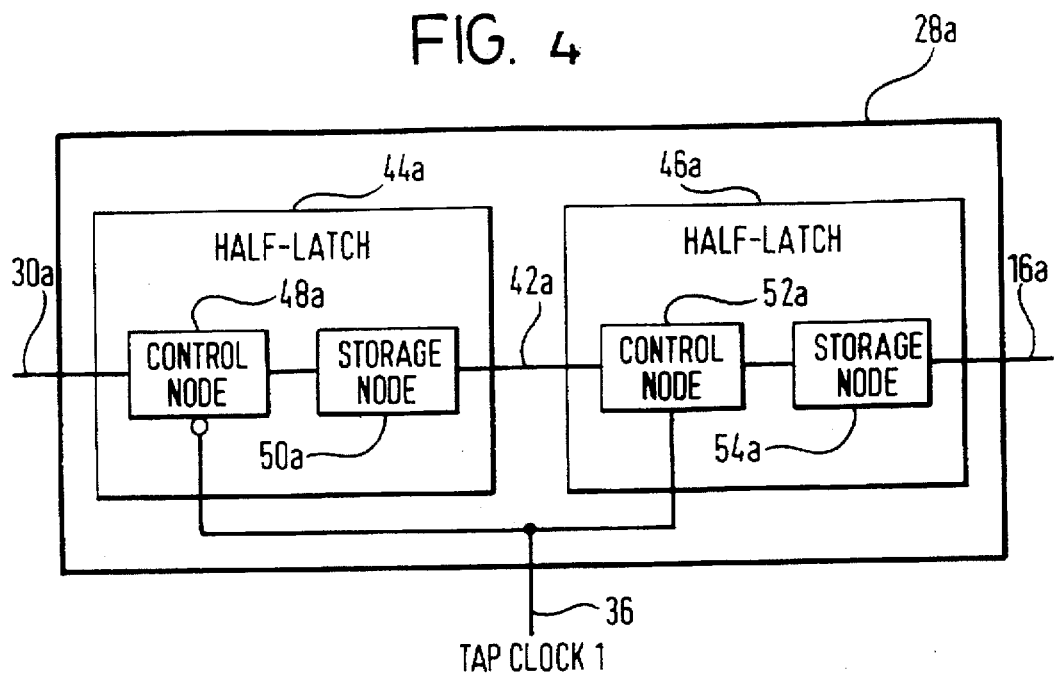
FIG. 4 is an example of an embodiment of a synchronous scan latch using half latches.
Figure 8:
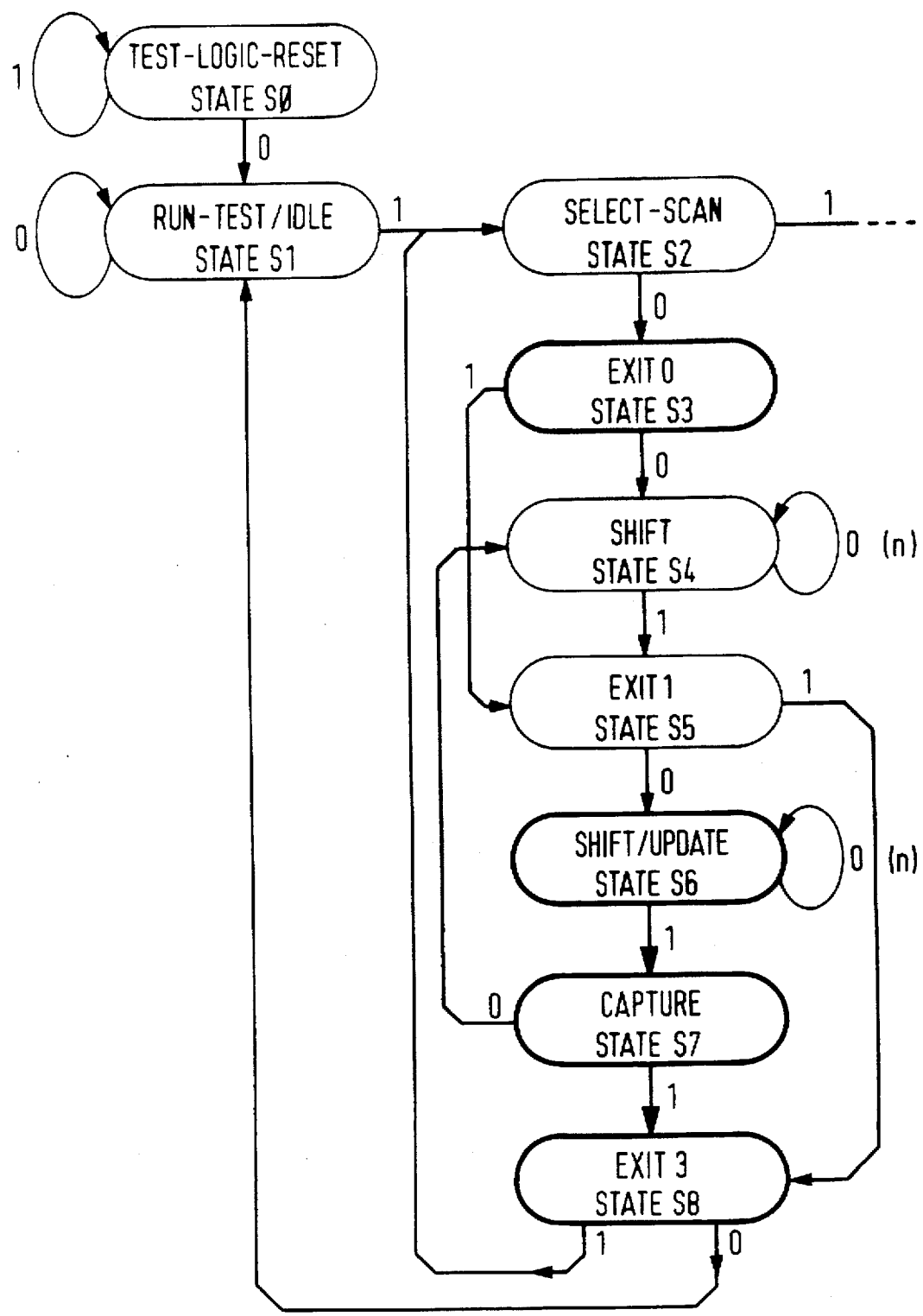
FIG. 8 is a partial state diagram for a test access port controller for carrying out a performance test according to an embodiment of the present invention.

Referring to the state diagram of FIG. 3, it can be clearly seen that after an update operation is performed during the time the TAP controller is in the state S8, two clock cycles of the TAP controller clock must elapse before a capture operation can be performed during state S3 to capture the result. It is an attribute of the performance test that a result can be quickly captured after an input is activated, to check that the speed at which the circuit operates is within design constraints. The performance test is thus arranged so that a capture occurs in the clock cycle after the update. Using the circuit of the present invention according to FIG. 5 or FIG. 6, the state diagram can be modified, as shown in FIG. 8, to enable performance testing. The performance test can be implemented using the TAP controller 12 discussed above and the state diagram of FIG. 3 merely by modifying the operation performed by each state, as shown in FIG. 8. The transition between subsequent states remains the same.

Figure 9:
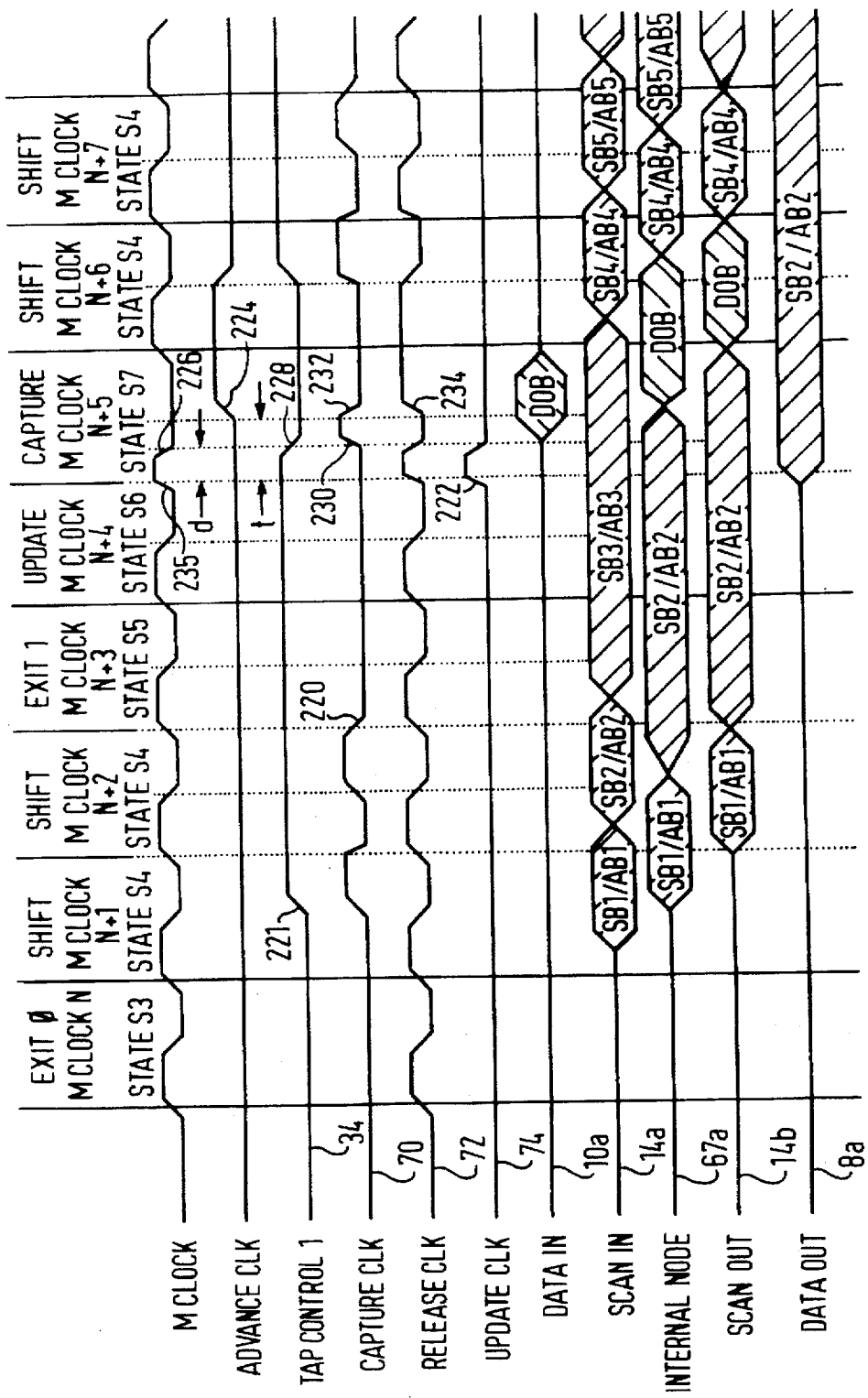
FIG. 9 is a timing diagram for the scan cell of FIG. 6 when carrying out a performance test.

FIG. 9 illustrates a timing diagram for the control of the scan test circuit of FIG. 6 to carry out a performance test. A performance test according to the present invention will now be described with reference to FIGS. 6, 8 and 9.

The TAP controller 12 is assumed to be in the select scan state S2 prior to setting it to carry out a performance test, as opposed to a structural test. MCLOCK denotes the TAP controller clock as before. On the first clock cycle MCLOCKN of MCLOCK an exit0 state S3 is entered and then on the subsequent clock cycle MCLOCKN+1 of the master clock a shift state S4 is entered. During this state, the multiplexor is connected to the scan in line 14a by changing the state of TAPCONTROL1 as illustrated by edge 221. A shift operation is carried out by clocking the capture half-latch 56a and then the release half-latch 60a for as many clock cycles as is required to clock all the sensitise bits into the chain of scan latches. These sensitise bits are denoted as SB1,SB2. During this operation the capture half-latch 56a and release half-latch 60a are clocked by clock signals CAPTURECLK on line 70 and RELEASECLK on line 72 respectively. Clocking of the capture half-latch places the sensitise bit SB1 onto the internal node on line 67a. Clocking the release half-latch places the sensitise bit SB1 on the scan out line 14b. Bit SB2 is shifted in the same way. In the last shift clock cycle MCLOCKN+2 the sensitise bit SB2 is shifted from the signal line 14a as the SCANIN signal to the signal line 14b as the SCANOUT signal. At the end of clock cycle MCLOCKN+2 the CAPTURECLK signal on line 70 goes low, as illustrated by edge 220, and remains low such that the capture half-latch 56a is in the data-retention state. The RELEASECLK signal continues to clock but as the signal on the internal node 67a is latched the signal on line 14b does not change. The TAP controller then enters an exit1 state S5 during clock cycle MCLOCKN+3 and a shift-update state S6 during clock cycle MCLOCKN+4. At the end of clock cycle MCLOCKN+4 the UPDATECLK signal on line 74 goes high, as illustrated by edge 222, causing the sensitise bit SB2 on the internal node 67a to appear on line 8a as the DATAOUT signal.

After the UPDATECLK signal goes high at the end of clock cycle MCLOCKN+4, the TAP controller will enter the capture state S7. At this stage the operation of the capture state is not important since a result to be captured has not yet been generated. However, during this capture state S7 the signal DATAIN on line 10a will change state in response to the sensitise bit SB2 having been placed on the DATAOUT signal line 8a.

The TAP controller then proceeds from the capture state S7 back to the shift state S4, and the same sequence of operations is carried out. However, this time in the shift state S4 during clock cycles MCLOCKN+1 and MCLOCKN+2 activation bits AB1,AB2 are shifted such that at the end of clock cycle MCLOCKN+4 the activation bit AB2 is the signal DATAOUT on line 8a. It is the result of this transition from sensitise bit SB2 to the activation bit AB2 on DATAOUT line 8a, after propagation through the combinational logic circuitry 5, which must be captured after a short, measurable time delay on the DATAIN signal line 10a.

During the next clock cycle MCLOCKN+5, the TAP controller is in its capture state S7. In this state, the master clock MCLOCK pulse width is reduced in width to a pulse width d and an advanced clock signal ADVANCECLK is produced having a positive edge 224 at a measured time location which is a predetermined time t from the positive edge 235 of MCLOCK. The reduced pulse width d has no effect on timing measurement. At some time after the activation bit AB2 has been placed on the input 8a to the combinational logic a data output bit DOB resulting from the activation input bit AB2 on line 8a is available on the line 10a to the multiplexor 26a. The line 10a is connected to the multiplexor by altering the state of TAPCONTROL1 on the negative edge 226 of the reduced cycle d of MCLOCK. The change of state of the multiplexor is represented by the falling edge 228 on line 34.

An aspect of the clocking sequence of FIG. 9 is the provision of the advance clock ADVANCECLK which independently produces the negative clock edge 232 of the clock CAPTURECLK in the capture period at time t from the positive edge 235 of the clock MCLOCK. This avoids the need to generate a "high frequency" clock on the master clock MCLOCK in the capture cycle, it also avoids having to clock the TAP controller at such a higher frequency.

The only purpose of the reduced pulse width d is to provide the positive edge 230 of the CAPTURECLK signal on line 70 from the negative edge 226 of the reduced pulse. The only requirement for the pulse width d is therefore that it must be less than the predetermined time t. Once the CAPTURECLK has gone high on edge 230 it can then be taken low on edge 232 under control of the advanced clock signal ADVANCECLK as discussed hereinabove.

After the multiplexor is switched on the falling edge 228 on line 34 the CAPTURECLK signal on line 70 goes high, represented by edge 230, causing the data output bit DOB to appear on the internal node 67a a short time afterwards. It is assumed that edge 230 occurs before the data output bit DOB settles and therefore does not play any part in the subsequent timing measurement and capture at the data output bit DOB on the edge 232 of the CAPTURECLK. When the capture clock signal CAPTURECLK goes low on edge 232 the capture half-latch is in the data-retention mode and the data output bit DOB is retained on internal node 67a.

The advanced clock signal ADVANCECLK may also be used to provide the early positive edge 234 of the RELEASECLK signal on line 72. After the RELEASECLK signal goes high on edge 234 the data output bit DOB retained on the internal node will appear on the line 14b as the SCANOUT signal. However, the timing of this release is not important.

The TAP controller again enters, on the next clock cycle MCLOCKN+6, the shift state S4. New sensitise or activation bits SB4/AB4,SB5/AB5 can then be shifted in on the SCANIN signal line 14a, and the data output bit DOB can be shifted out on the SCANOUT signal line 14b.

Preferably, the sensitise bit pattern supplied to the chain of scan latches activates a critical timing path on the transition of the inputs of the combinational logic circuitry 5 between the sensitise and activation patterns. It will readily be appreciated that the point of a performance test is to measure the time between placing the activation input bits on the inputs 8a,8b etc. of the combinational logic circuit and the appearance of the data output bit at line 10a. The performance test sequence can be repeated for different patterns to exercise different timing paths. It can be seen that the time delay from the sensitise update to the capture of the corresponding result is the period t in the capture state. This period t may be adjusted to determine the smallest delay possible which still results in the correct output data for a particular set of inputs.

The scan cell illustrated in FIG. 6 can therefore perform either a structural test or a performance test. However it does have features which make it inefficient in certain aspects, particularly for carrying out a performance test. Firstly, three clocks are required which consume more power than would a single clock. Secondly, because the three clocks are independent, the clock trees (i.e. derived clocks) are separate, and the accuracy of performance testing is compromised. To overcome these disadvantages a new half-latch is provided which incorporates an enable function to effectively gate a clock signal supplied to it. This may be constructed in a number of ways using two transmission gates in series, inserting a gating function in the clock path, or using a complex gate which merges the clock gating function with the storage node. It is expected that other ways of implementing such a half-latch will be apparent to a person skilled in the art.

Figure 10:
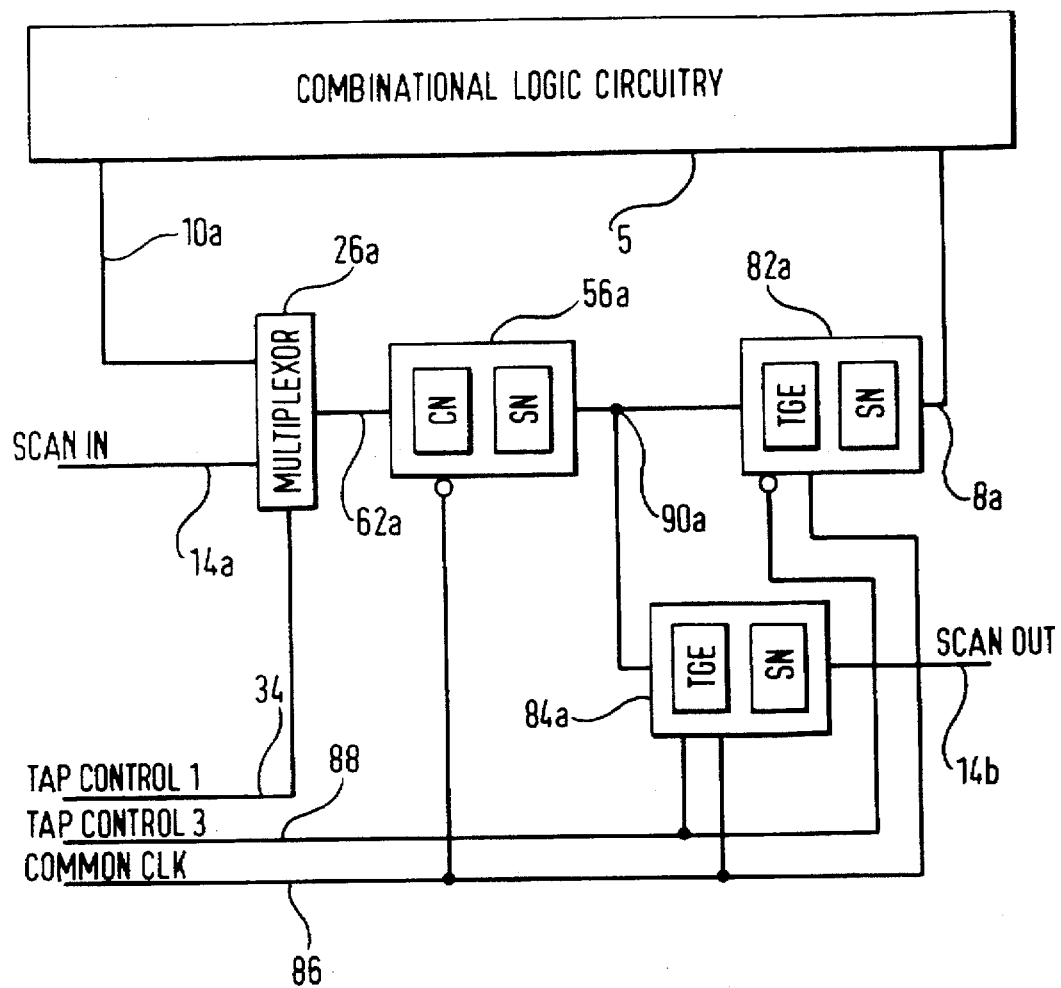
FIG. 10 is a circuit diagram of a scan cell in accordance with another embodiment of the present invention.

FIG. 10 shows the circuit of FIG. 6 with the release and update half-latches 58a and 60a replaced by two half-latches 82a and 84a of the type discussed above, i.e. each having a transmission gate TGE with an enable input, and a storage node SN. The arrangement of FIG. 10 has the advantage over FIG. 6 of requiring only one clock signal COMMONCLK supplied to all the half-latches leading to reduced power consumption and a reduced number of clock signal lines. The capture half-latch 56a receives the inverse of the clock signal applied to the release half-latch 84a and the update half-latch 82a. Because there is only one clock signal there is only one clock tree which leads to more accurate performance testing.

A further control signal TAPCONTROL3 is provided to the release half-latch 84a and, inverted, to the update half-latch 82a. The two control signals TAPCONTROL1 and TAPCONTROL3 are generated from within the TAP controller and are inactive during normal functional operation. For normal functional operation of the IC 2 the control signal TAPCONTROL1 is low and the control signal TAPCONTROL3 is low. For an update operation (which inherently incorporates a shift) TAPCONTROL1 is high, and TAPCONTROL3 is low. For a capture operation (which inherently incorporates a shift) TAPCONTROL1 is low and TAPCONTROL3 is high. For a shift operation (scan in or scan out) TAPCONTROL1 is high and TAPCONTROL3 is high. Additionally, an asynchronous update operation (with no inherent shift) may be achieved while the clock COMMONCLK is kept high and a negative edge occurs on TAPCONTROL3, as will be described hereinbelow.

Figure 11:
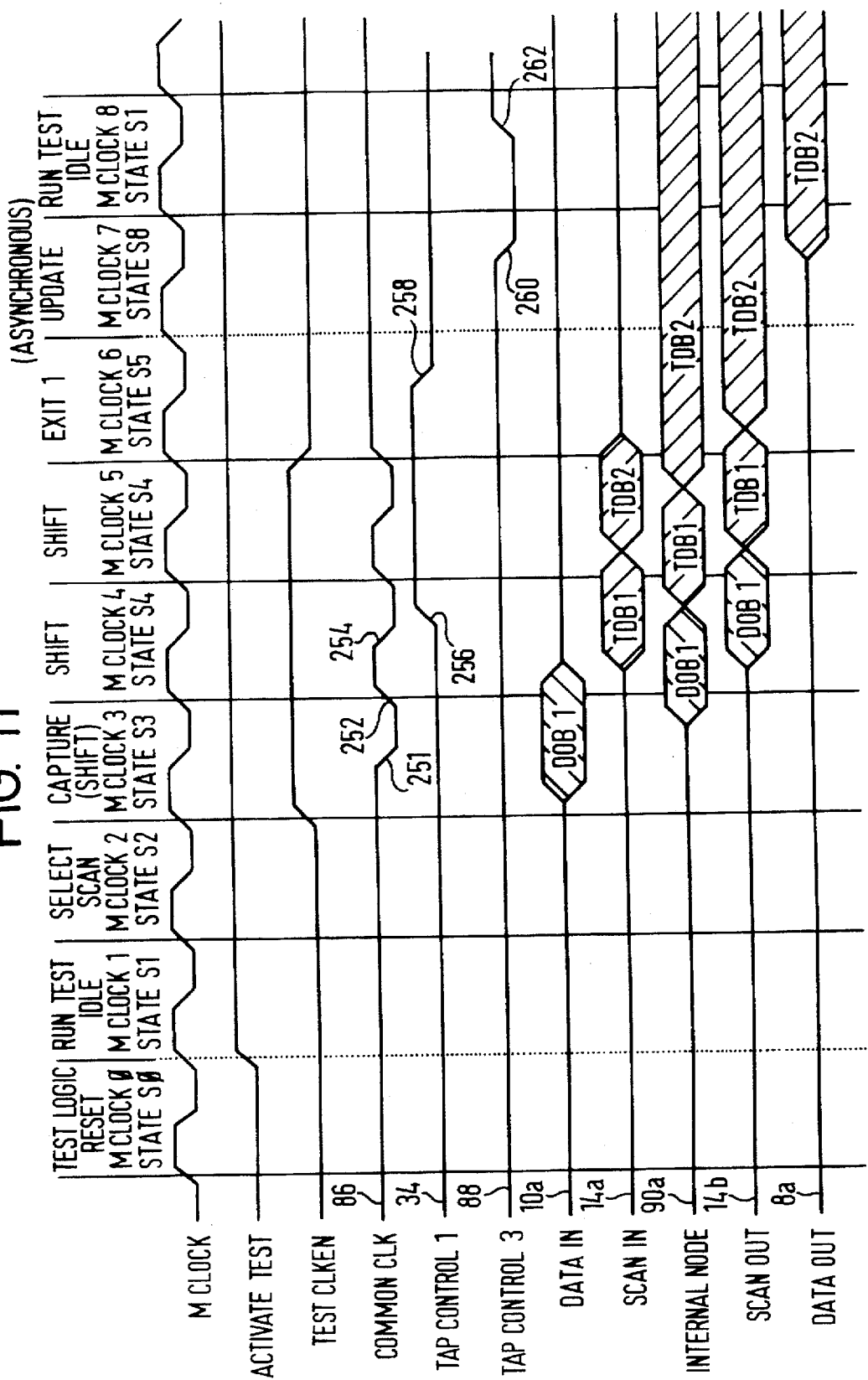
FIG. 11 is a timing diagram for the scan cell of FIG. 10 when used to carry out a structural test.

FIG. 11 shows a timing diagram for the circuit of FIG. 10 for carrying out a structural test. Reference is also made to the state diagram of FIG. 3.

At the beginning of the clock cycle MCLOCK0 of the master clock MCLOCK, the TAP controller is in the reset state S0. At the end of the clock cycle MCLOCK0, a signal ACTIVATE TEST goes high so that in the next clock cycle MCLOCK1 of the TAP controller 12 it will enter a run-test-idle state S1 and then on the following clock cycle MCLOCK2 enter a select-scan state S2. At the beginning of the clock cycle MCLOCK3, a capture state S3 (with inherent shift) is entered and a test clock enable signal TESTCLKEN is set high. This allows the common clock COMMONCLK on line 86 to commence running. At the beginning of clock cycle MCLOCK4, a data output bit DOB1 will be present on the data input 10a, which may be the result output from a previous test. At the beginning of clock cycle MCLOCK4, as the TAP controller moves from state S3 into a shift state S4, the capture operation is performed, and the bit captured on line 90a is also shifted on the SCANOUT line 14b. Although this shift operation is caused by the capture operation of clock cycle MCLOCK3, its effect is not actually seen until the next clock cycle MCLOCK4.

Up to this point the control signal TAPCONTROL1 is low to connect the data on input 10a to the output of the multiplexor 26a, and the control signal TAPCONTROL3 is high to enable the release half latch and to hold the update half-latch in a data retention state. When the clock COMMONCLK goes low on edge 251 the data DOB1 on the output 10a of the combinational logic circuitry 5 is dynamically reflected on the internal node 90a. On the rising edge 252 of the clock COMMONCLK the current data bit on the DATAIN signal line 10a is captured and held on the internal node on line 90a. At the same time the release half-latch is enabled to place the data DOB1 on the node 90a onto the SCANOUT signal line 14b. When the negative edge 254 of COMMONCLK occurs during MCLOCK4, the signal on the SCANOUT line 14b is held or retained. During MCLOCK4, the control signal TAPCONTROL1 switches from low to high as illustrated by edge 256 causing the multiplexor 26a to input the signal on the SCANIN signal input line 14a. Consequently in the two clock cycles MCLOCK4, MCLOCK5, the TAP controller is in shift state S4 and two scan test values TDB1,TDB2 are sequentially shifted onto the SCANOUT signal line 14b. It will be appreciated that there are normally n clock cycles in the shift state as discussed above with reference to FIG. 2. At the rising edge of MCLOCK6, the exit1 state S5 is entered, the signal TESTCLKEN is put low and on the falling edge of MCLOCK the signal TAPCONTROL1 is put low as illustrated by edge 258. The positioning of edge 258 is not important since it has no effect, and this edge could therefore be positioned in any subsequent cycle. During MCLOCK7 the update half-latch is enabled by edge 260 of TAPCONTROL3 going low and the test data bit TDB2 on node 90 appears on the input 8a to combinational logic circuitry 5. It will be appreciated that the clock signal COMMONCLK on line 86 at this point is high so that the update half-latch will, when enabled, adopt the data transfer state. The edge 260 is not synchronised to a clock edge of the master clock MCLOCK, and consequently the update operation achieved by the edge 260 is asynchronous and there is no inherent shift operation associated with this update. This is referred to as "asynchronous update". During MCLOCK8 run-test idle state S1 is entered, and TAPCONTROL3 returns to a high state on edge 262. It can be seen that all critical operations are synchronous, taking place on the positive edge of the clock COMMONCLK, with the exception of the operation which occurs when the signal TAPCONTROL3 changes from high to low on edge 260 in MCLOCK7, this operation being asynchronous. This asynchronous operation is an important feature of the circuit of FIG. 10 which enables the state diagram according to IEEE Standard 1149.1-90 to implement an update during a structural test. In the structural test mode, timing of the update is not critical and the asynchronous change on the output line 8a is not significant.

Figure 12A:
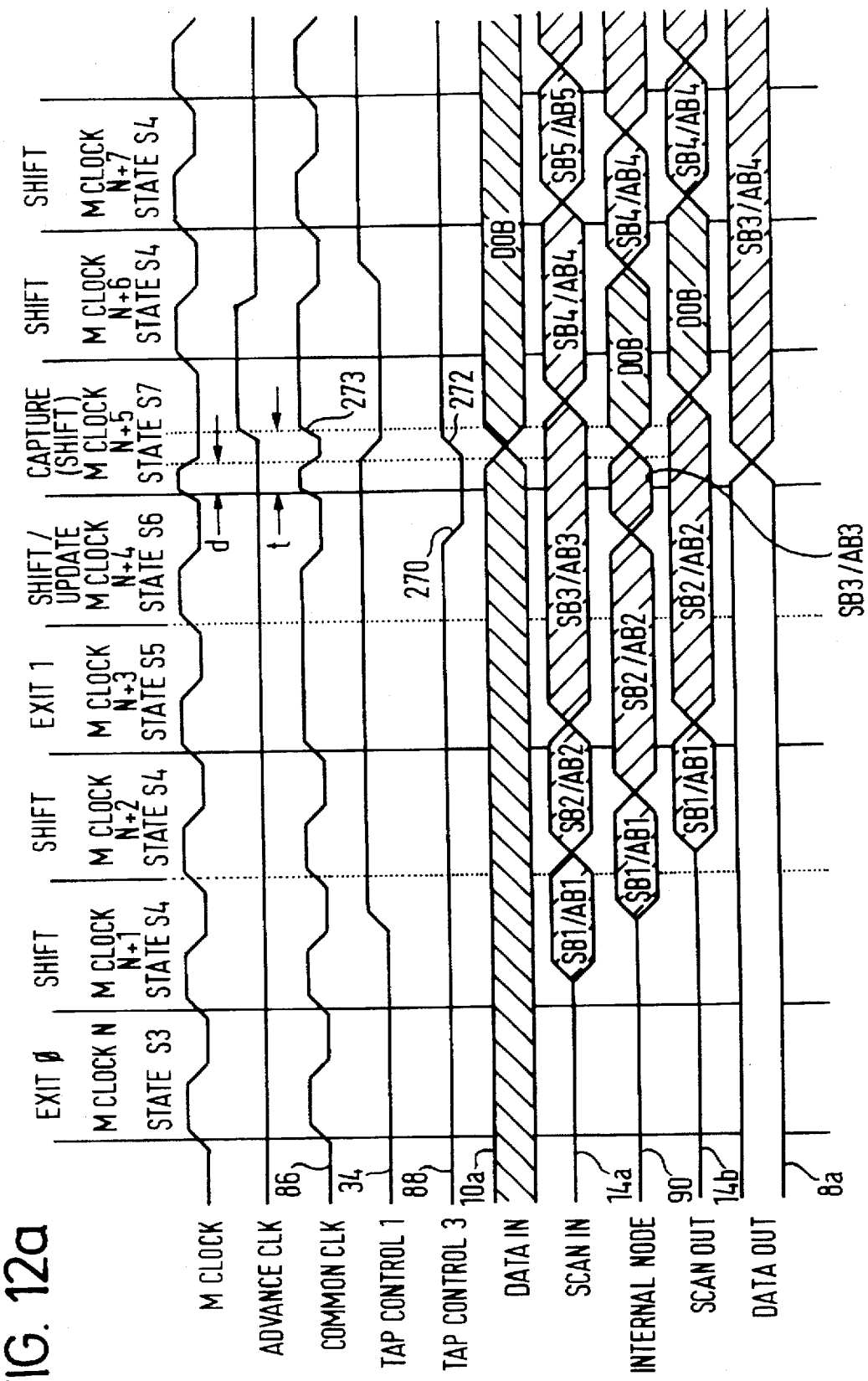
FIGS. 12a and 12b are timing diagrams for a scan cell according to FIG. 10 when used to carry out a performance test.
Figure 12B:
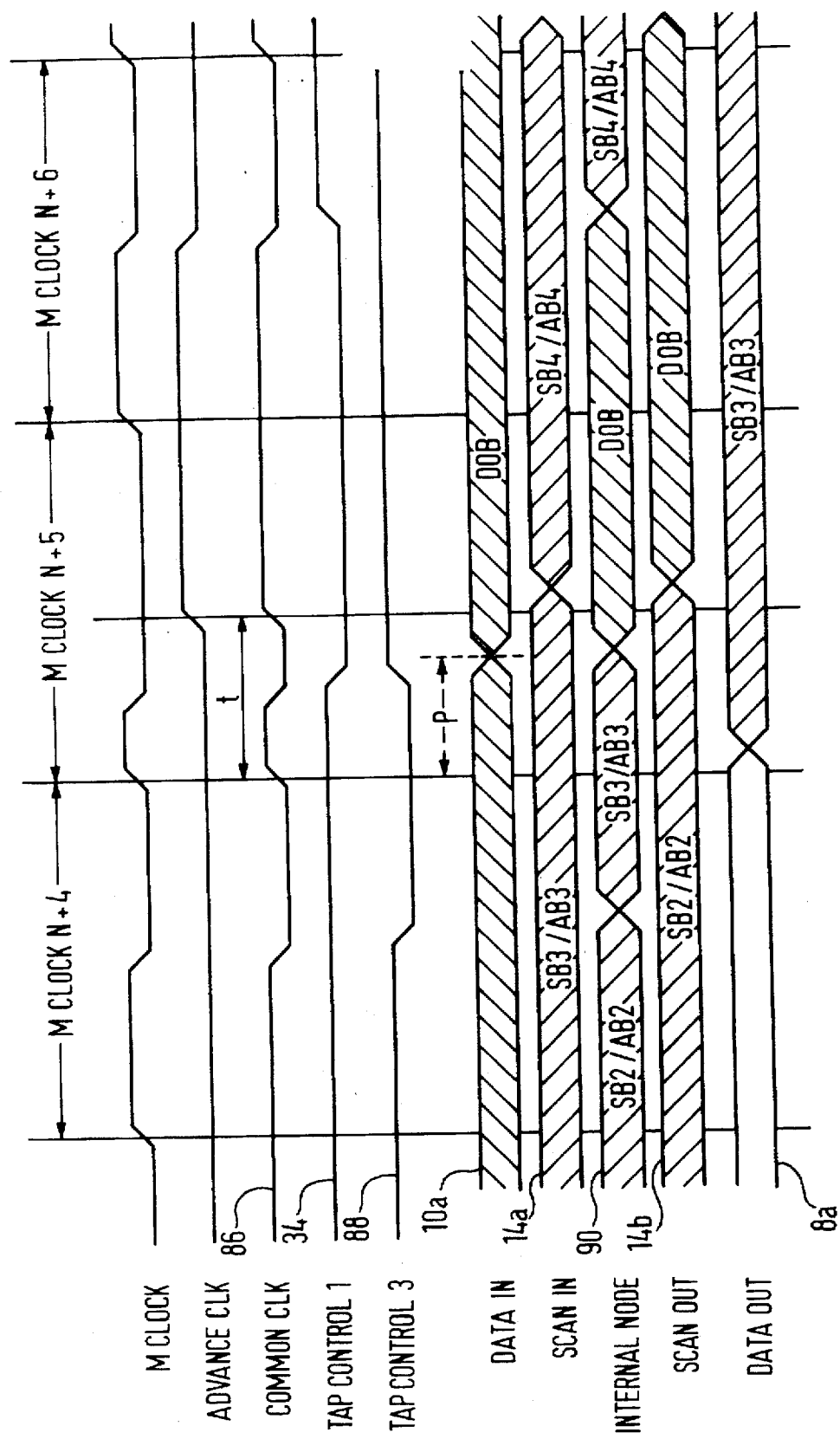

Referring to FIGS. 12a and 12b the operation of the circuit of FIG. 10 during a performance test will now be described with reference to the state diagram of FIG. 8. FIG. 12b is an expanded view of the cycles MCLOCK5 to MCLOCK7 of FIG. 12a during which the critical timing paths of the performance test occur.

The operation of the circuit of FIG. 10 is similar to that of FIG. 6 when carrying out a performance test, so the common elements will not be described. The following is a discussion of the differences between the timing sequences for the circuit of FIG. 6 and the timing sequences for the circuit of FIG. 10.

In FIG. 12b, the timing of the common clock COMMONCLK produced by combining the master clock MCLOCK and the reference clock ADVANCECLK is shown.

Control of the update function is different in the circuit of FIG. 12. As shown in FIG. 12a, the signal TAPCONTROL3 changes state from high to low, represented by edge 270, on the falling edge of COMMONCLK in TAP clock cycle MCLOCKN+4. This means that when COMMONCLK goes high at the beginning of capture cycle MCLOCKN+5, the update half-latch is put into its data transfer state and transfers the bit which is then on its input at node 90a to the output on line 8a. This provides the activation input bit for the performance test. The control signal TAPCONTROL3 is then changed from its low to its high state, represented by edge 272, to hold that bit on the output of the update half-latch so that the output is held for subsequent edges of COMMONCLK.

The data output from the functional logic circuit 4 as a result of the activation input bits is captured on the rising edge 273 of the clock COMMONCLK on line 86. The timing of edge 273 is controlled by the advanced clock signal ADVANCECLK.

Measurement of the performance of the functional logic is carried out in the same way as discussed above with reference to FIG. 9.

FIG. 12b illustrates more clearly the principle underlying the performance test. The arrow p represents the propagation time through the combinational logic circuit 5, or the time taken for the data output to change from one state to another when the input bits are changed from the sensitised pattern to the activation pattern. As explained above, a measure of this time can be gained by alterations of the timing delay t between a positive edge of MCLOCK and positive edge of ADVANCECLK.

The advance clock signal ADVANCECLK is introduced because it is desirable to increase the speed of the common clock signal COMMONCLK during the capture cycle MCLOCKN+5. However, it is not desirable to introduce a rapid cycle in the master clock MCLOCK. Furthermore, once the common clock signal COMMONCLK has performed a rapid clock cycle during period MCLOCKN+5, it must be inhibited for the next rising edge of the master clock MCLOCK, otherwise the master clock and common clock will lose synchronisation. If synchronisation between these two clocks is lost, some of the test bits scanned in or out may also be lost. Therefore at the beginning of cycle MCLOCKN+6 the TAP controller receives a positive clock edge, but the COMMONCLK signal does not generate an edge.

Figure 13:
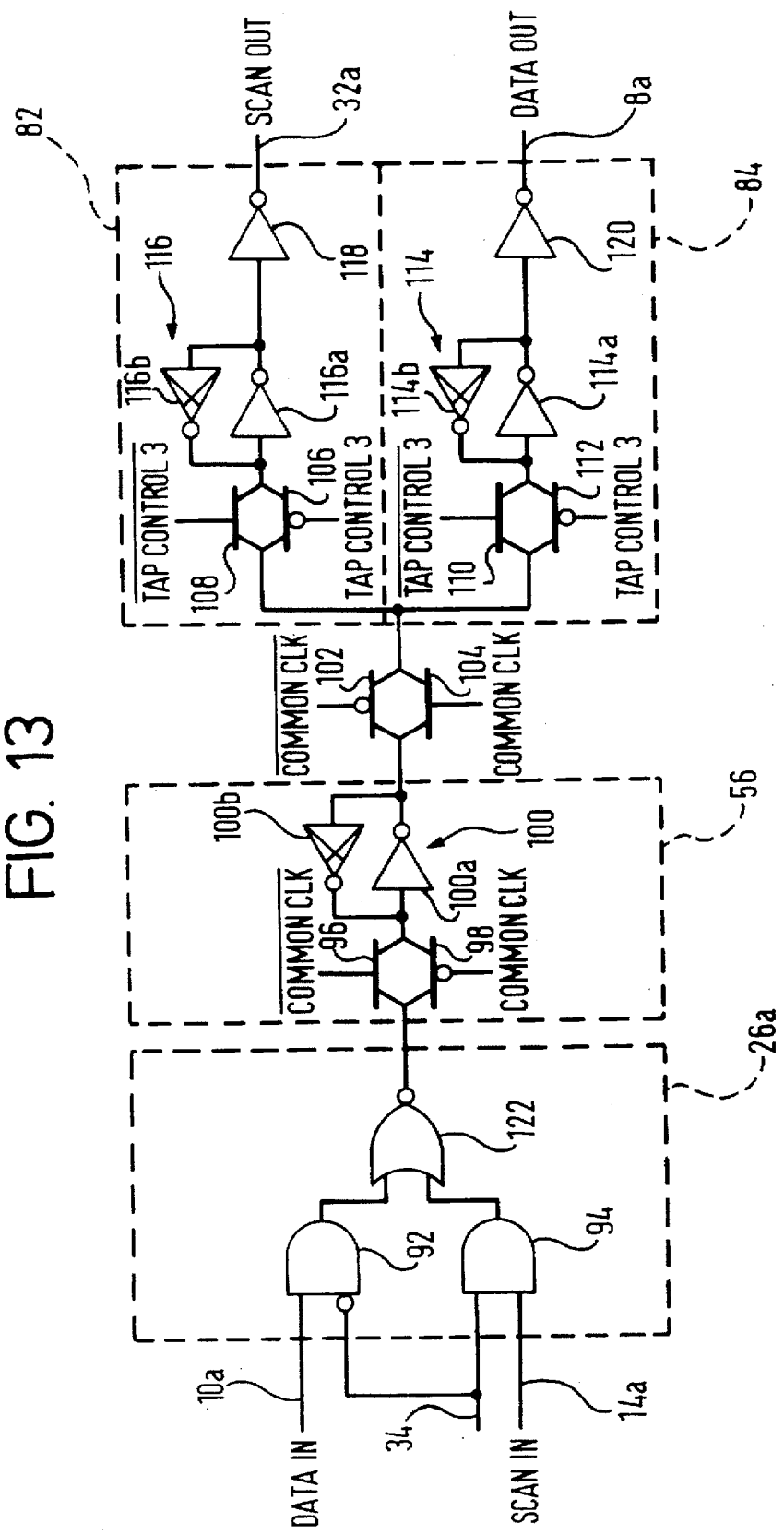
FIG. 13 is a circuit implementation of a scan cell used in the circuit of FIG. 10.

FIG. 13 shows an example of an implementation of the circuit of FIG. 10 using known circuit components. The multiplexor 26a consists of two AND gates 92 and 94 and a NOR gate 122. It can be seen that the signal TAPCONTROL1 on line 34 is inputted directly to the AND gate 94, but is inverted on the input of AND gate 92. The half-latch 56 consists of a pass gate comprising two complementary transistors 96 and 98 and a back to back inverter arrangement 100, comprising a strong inverter 100a and a weak inverter 100b. The half-latch 82 comprises a pass gate comprising two complementary transistors 106 and 108, a pair of back to back inverters 116 and an inverter 118. The back to back inverters 116 comprise a strong inverter 116a and a weak inverter 116b. The half-latch 84 comprises a pass gate comprising two complementary transistors 110 and 112, a pair of back to back inverters 114 and an inverter 120. The back to back inverters 114 comprise a strong inverter 114a and a weak inverter 114b. The half-latches 82 and 84 further share a pass gate comprising complementary transistors 102,104.

Figure 14:
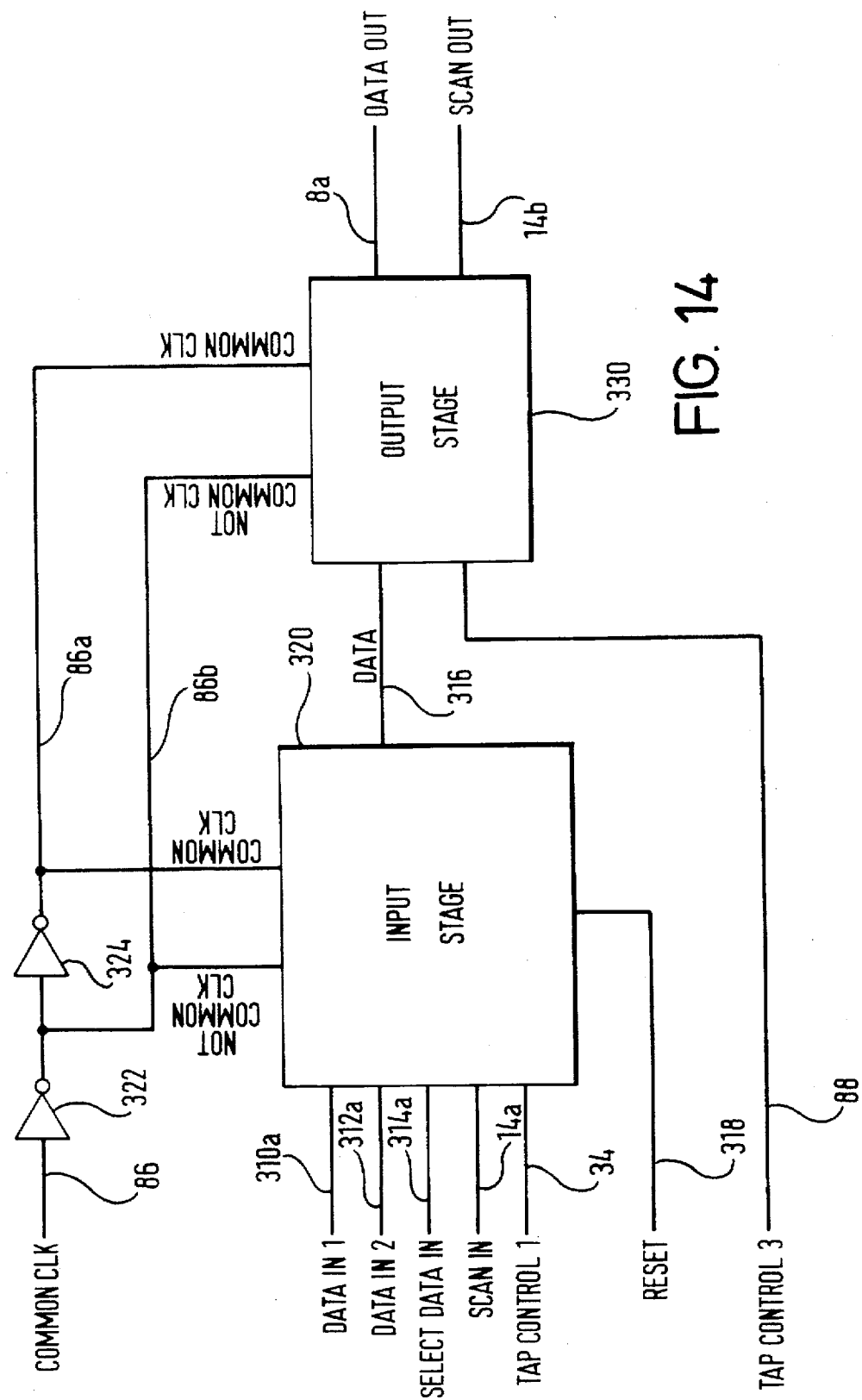
FIG. 14 is a schematic of a further circuit implementation of the scan cell of FIG. 10.

FIG. 14 illustrates a further example of how the present invention may be implemented. FIG. 14 is an illustrative example of how a scan cell as shown in the schematic diagram of FIG. 10 may be implemented. The scan cell of this example consists of an input stage 320 (corresponding approximately to the multiplexor 26a and the latch 56a of FIG. 10) and an output stage 330 (corresponding approximately to the half latches 82a and 84a of FIG. 10). The implementation of the invention illustrated in FIG. 14 also shows how the invention can be extended by adding an additional multiplexor to the input stage which enables functional selection from one of two data inputs, and by adding a synchronous reset facility.

The input stage receives the signals SCANIN on line 14a and TAPCONTROL1 on line 34, together with signals DATAIN1 on line 310a, DATAIN2 on line 312a, SELECTDATAIN on line 314a and RESET on line 318. The illustrated example differs to the schematic of FIG. 10 in that it has two data inputs, DATAIN1 and DATAIN2. However, only one data input can be selected at any one time by the select signal SELECTDATAIN. The signal RESET on line 318 is used to reset the input stage 320. The input stage 320 outputs a signal DATA on line 316 which forms an input to the output stage 330. The signal TAPCONTROL3 on line 88 forms a second input to the output stage. The output stage outputs the signal DATAOUT on line 8a and the signal SCANOUT on line 14b. Both the input and the output stages receive the signal NOTCOMMONCLK on line 86b via gate 322 and the signal COMMONCLK on line 86a via gates 322 and 324.

Figure 15A:
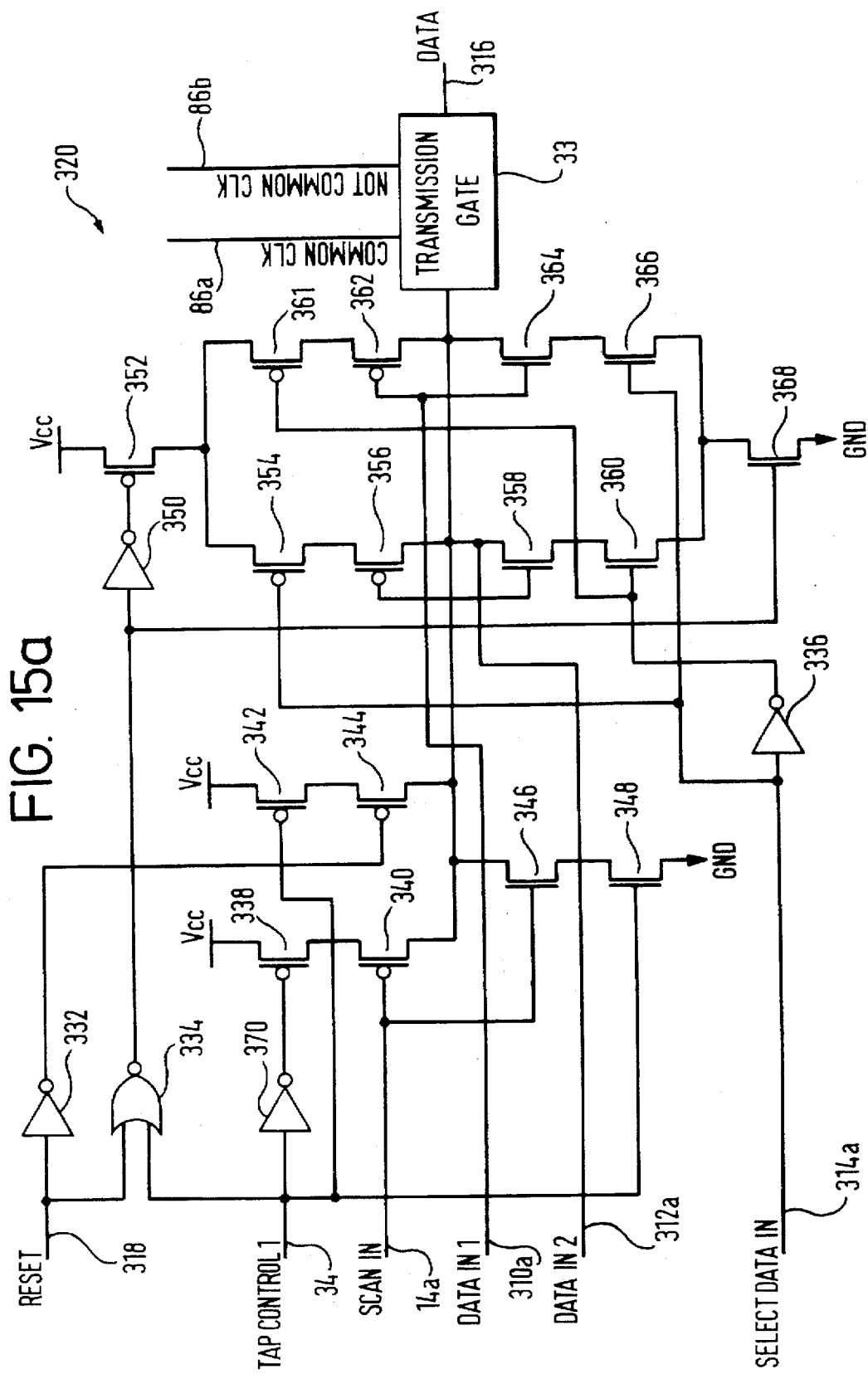

The operation of the circuit of FIG. 14 can be readily understood with reference to FIG. 15a and 15b. FIGS. 15a and 15b fully illustrate the input stage 320 and the output stage 330 respectively.

The input stage 320, as shown in FIG. 15a, comprises a number of gates, 332,334,336,350 and 370, a number of transistors 338 to 348 and 354 to 368, and a transmission gate 331.

The output stage 330, as shown in FIG. 15b, comprises an inverter gate 388, a number of latches 380, 390, 394, two inverters 392,396 and a number of transmission gates 382 to 386. As is well known, each of the latches 380, 39.0 and 394 comprise a strong inverter 380a, 390a and 394a coupled with a respective relatively weak inverter 380b, 390b and 394b respectively.

The transmission gates 330,382,384,386 each comprise a pair of complementary transistors corresponding to the transistor pairs 98,98; 102,104; 108,106; and 110,112 respectively of FIG. 13.

It should be apparent to a person skilled in the art having reference to the foregoing description of FIG. 10 how the circuit implementation of FIGS. 14, 15a and 15b operates, and this operation will therefore not be further described.

Figure 16:
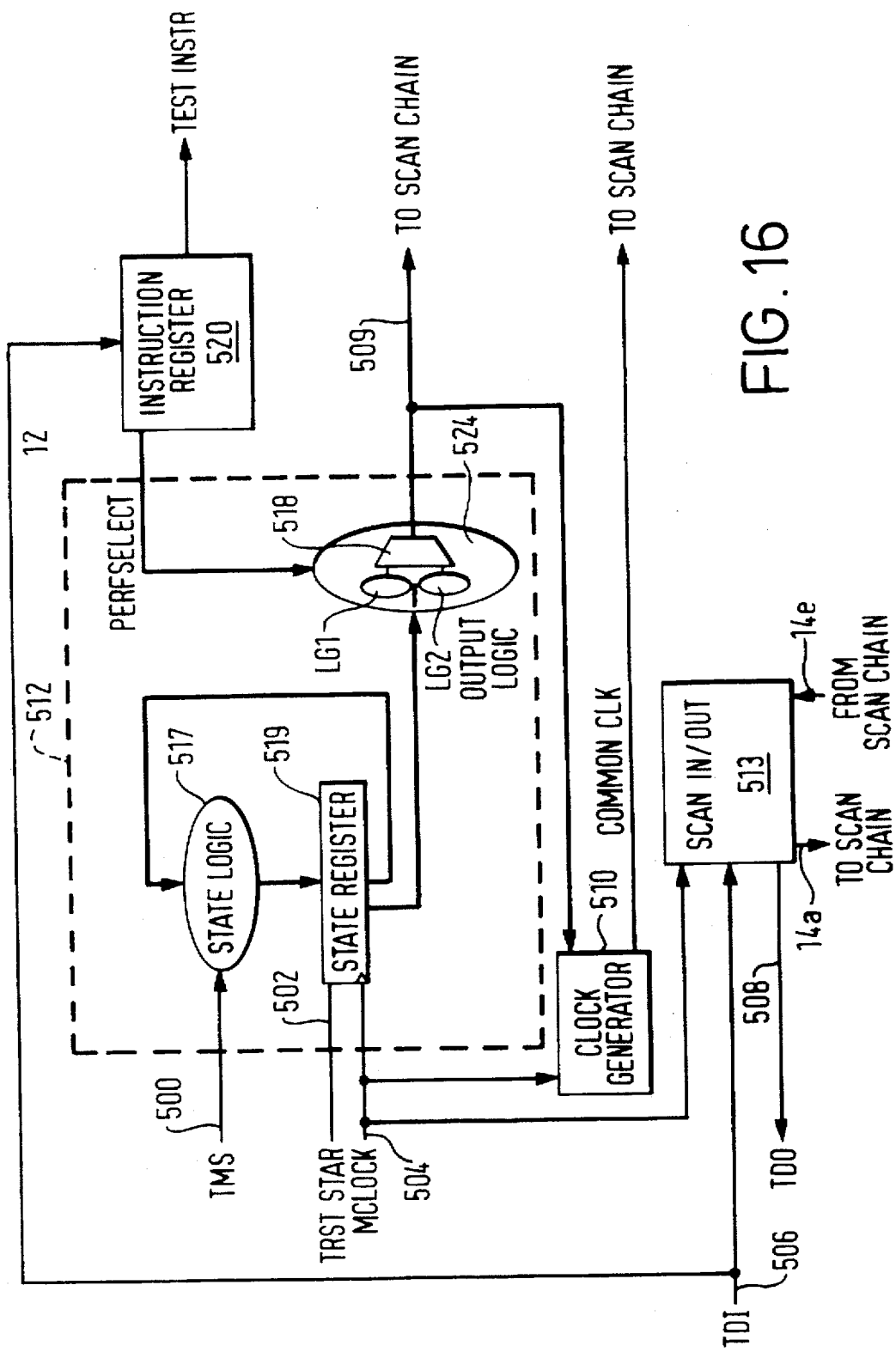
FIG. 16 is a block diagram of a TAP controller capable of carrying out either a structural test or a performance test.

Reference will now be made to FIG. 16 to describe a TAP controller capable of carrying out either a structural test or a performance test. The TAP controller is designated by reference numeral 12 in common with FIG. 1, and its connections to the scan chain are denoted 14a and 14e in common with FIG. 1. That is, test data bits are output on line 14a and resultant data bits are input on line 14e. The TAP controller 12 receives input signals on ports as defined in the IEEE STANDARD referred to earlier:

TMS (test mode select) on line 500;

TRST STAR (test reset—active low) on line 502;

MCLOCK (corresponding to the standard TCK) on line 504;

TDI (tap data in) on line 506.

TDO on line 508 represents output TAP data which is the data received on line 14e following a scan test. TDI on line 506 denotes input TAP data which in normal use of the TAP controller 12 is supplied to the scan chain via line 14a. The TAP controller 12 comprises a state machine 512 which comprises, as is well known in the art, state logic 517 and a state register 519 for sequentially cycling through the states shown in the state diagram of FIG. 3. The state logic 517 is connected to receive the TMS signal and the state register is connected to receive the TRST STAR signal and the TAP clock MCLOCK. The implementation of the state machine 512 will be well known to a person skilled in the art and is therefore not described herein. The TAP controller 12 also includes a clock generator 510 which converts the signal MCLOCK to the signal COMMONCLK. The TAP controller shown in FIG. 16 differs from a conventional TAP controller in that the interpretation of each of the states through which the state machine cycles can be changed in dependence on whether the TAP controller 12 is to implement a structural test or a performance test.

For this purpose, the TAP controller 12 also includes an instruction register 520 which is loaded with an instruction concerning whether the test is a structural test or a performance test via the TDI signal on line 506. Also, the state machine 512 includes output logic 524 which receives state commands from the state register 519 and interprets them to provide the TAP control signals on output line 509. The output logic 524 comprises two sets of logic gates LG1,LG2 connected to a multiplexor 518. An output signal selecting performance test PERFSELECT is supplied to the multiplexor 518 to alter the interpretation of each state. Either the set of logic gates LG1 or the set of logic gates LG2 is connected to the output line 509 under the control of the signal PERFSELECT which is output from the instruction register 520.

The first set of gates LG1 in the output logic 524 interprets each state of the state machine 512 in the manner shown in FIG. 3 to implement a structural test. The second set of logic gates LG2 interprets each state of the state machine in the manner illustrated in FIG. 8 to implement a performance test. All that is required therefore is to select either the first set of gates or the second set of gates within the output logic 524 to generate appropriate TAP control signals for implementing either a structural test or a performance test. This selection is done by controlling the multiplexor 518 through the PERFSELECT signal. The selection between the first and second sets of logic gates could be carried out in any other suitable manner. The manner described herein however represents only a small modification to an existing TAP controller.

The selected TAP control signals on line 509 are also supplied to the clock generator 510 to generate the signal COMMONCLK compatible with the selected test, as described in more detail hereinafter.

As an alternative to selecting between first and second sets of logic gates, it would be possible to have a programmable logic array or similar within the output logic 524 so that connections between individual gates could be selected to define whether or not the TAP controller carries out a structural test or a performance test.

Figure 17:
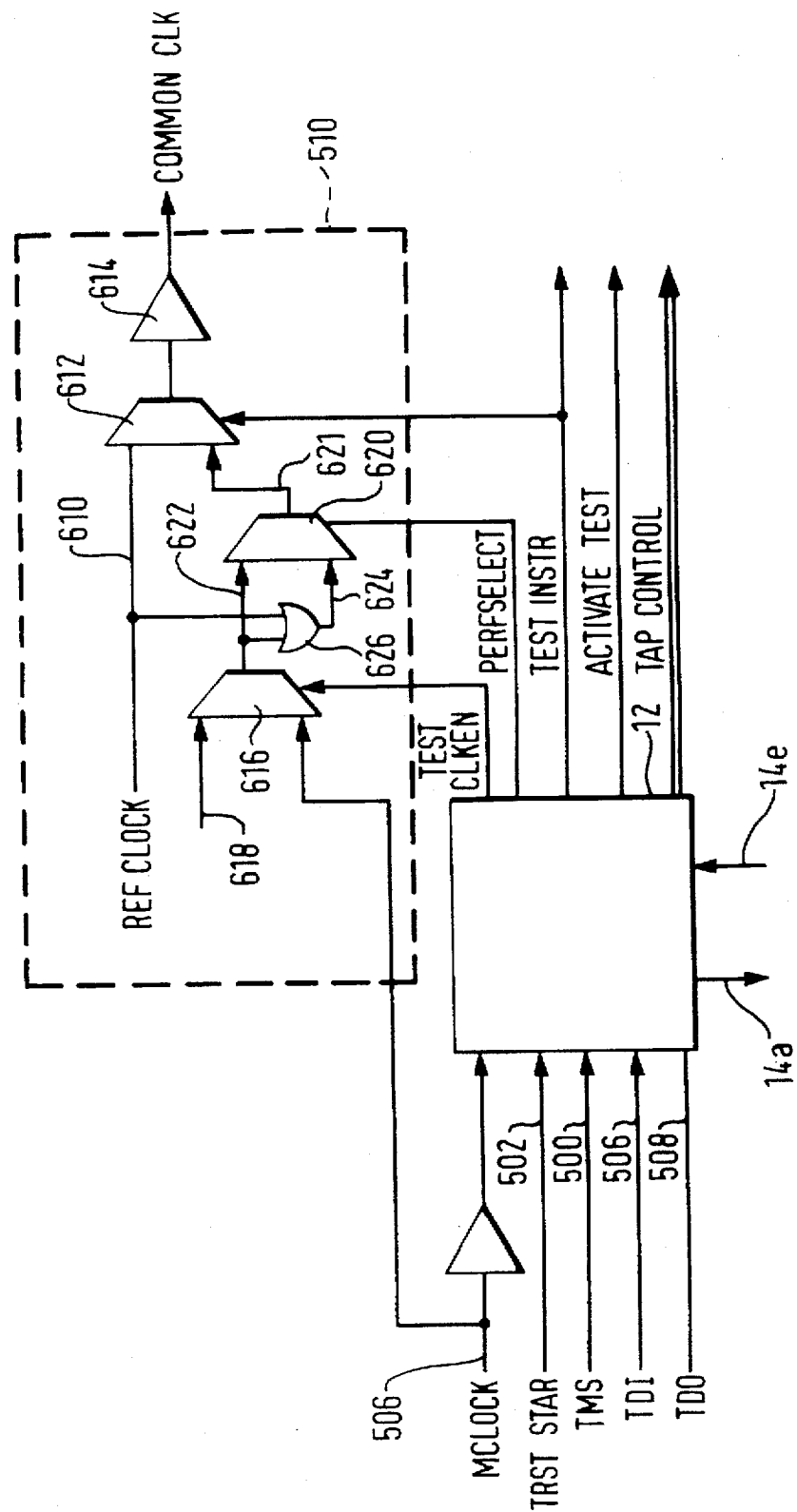
FIG. 17 is a block diagram illustrating a clock generator for the TAP controller.

FIG. 17 is a block diagram of the TAP controller 12 together with the clock generator 510 which generates the clock signal COMMONCLK for the single clock embodiments described above. The inputs and outputs of the TAP controller 12 have been described already with reference to FIG. 16 and therefore will not be described further, except to point out that the output signals include TESTCLKEN, ACTIVATE TEST and PERFSELECT which are shown specifically because they affect generation of the clock signal COMMONCLK. The other control signals generated by the TAP controller are represented by a plurality of signals TAPCONTROL.

A multiplexor 612 supplies the output signal COMMONCLK which is derived in normal functional mode from a reference clock REFCLOCK on line 610 and in a test mode from an input on line 621. Control of the multiplexor 612 is by the ACTIVATE TEST signal from the TAP controller 12. A second multiplexor 616 receives an input on line 618 which is normally held at logic value 1 and the signal MCLOCK on line 506. The output of the second multiplexor 616 is fed to a third multiplexor 620 on line 622. The third multiplexor 620 has a second input on line 624 which is the output of an OR gate 626 which has as its inputs REFCLOCK and the output of the second multiplexor 616. The output of the third multiplexor is connected as an input on line 621 to the output multiplexor 612. The second multiplexor is controlled by the TESTCLKEN signal output from the TAP controller 12. The third multiplexor is controlled via the PERFSELECT signal output from the TAP controller 12.

For a structural test, the signal COMMONCLK is derived as follows. The signal ACTIVATE TEST switches the multiplexor 612 so that the signal output from the multiplexor 612 is taken from line 621. A performance test has not been selected, so the input to the multiplexor 620 is taken on line 622 from the multiplexor 616. This multiplexor outputs the input on line 618 which is a logical value 1 except during the period when the signal TESTCLKEN is active. During this period, it outputs the signal MCLOCK on line 506. Thus, the signal COMMONCLK as shown in FIG. 11 for a structural test is generated.

For a performance test, the signal COMMONCLK is derived as follows. As before, the signal ACTIVATE TEST has switched the inputs to the multiplexor 612 so that it outputs through a buffer 614 the input on line 621. In this case, the signal PERFSELECT is active so that input to the multiplexor 620 is taken on line 624 as the logical "OR" of the reference clock on line 610 or the output of the multiplexor 616. The multiplexor 616 supplies as an output on line 622 the signal MCLOCK except for a period when the inputs to that multiplexor 616 are switched to provide the output as a logical 1. The timing for this is shown in FIG. 12a. Furthermore, the signal REFCLK is not as in normal functional mode, but is a special clock used to provide the second timing edge for the performance test and is denoted ADVANCE CLK in FIG. 12a. Thus, the signal COMMONCLK has the form shown in FIG. 12a output through the buffer 614.

What is claimed is:

1. A test access port controller for implementing scan testing with a chain of scan latches comprising:

logic circuitry for generating a plurality of control signals to said scan latches;

a data output for outputting test data to said scan latches;

a data input for receiving resultant data from said scan latches, so that said resultant data can be compared with expected data;

a signal generator including a test clock for implementing a structural test at a predetermined frequency and for outputting timing signals to said scan latches;

a state indicator connected to said logic circuitry and to said signal generator for selecting a mode of operation of said controller from a first mode of structural test which provides resultant data dependent on a predetermined extant set of test data and a second mode of performance test which provides resultant data dependent on a change from a first set of test data to a second set of test data within a time period controllable independent of the test clock frequency for the structural test.

2. A test access port controller according to claim 1 wherein said logic circuitry comprises first and second logic gates for outputting respectively control signals for implementing a structural and a performance test, said state indicator being operable to select the appropriate one of said first and second sets of logic gates.

3. A test access port controller according to claim 2 which comprises a multiplexor connected to the outputs of said first and second logic gates, said state indicator providing a signal to control switching of the multiplexor to provide outputs appropriate to the selected test mode.

4. A test access port controller according to claim 2 wherein said logic circuitry comprises a programmable logic array, the configuration of which can be set in response to a signal from said state indicator.

5. A test access port controller according to claim 1 wherein said state indicator is provided by a control bit held in an instruction register of the controller.

6. A test access port controller according to claim 1 wherein the state indicator comprises a code stored in an instruction register of the controller.

7. A test access port controller according to claim 1 which comprises a state machine for sequentially cycling through a plurality of states and including state logic for defining each state and a state register for controlling said cycling and for outputting state commands to said logic circuitry.

8. A test access port controller according to claim 1 wherein the signal generator is capable of generating two signals defining said controllable time period when said performance test is selected.

9. An integrated circuit comprising:

a chain of scan latches;

logic circuitry for generating a plurality of control signals to said scan latches;

a data output for outputting test data to said scan latches;

a data input for receiving resultant data from said scan latches, so that said resultant data can be compared with expected data;

a signal generator including a test clock for implementing a structural test at a predetermined frequency and for outputting timing signals to said scan latches;

a state indicator connected to said logic circuitry and to said signal generator for selecting a mode of operation of said controller from a first mode of structural test which provides resultant data dependent on a predetermined extant set of test data and a second mode of performance test which provides resultant data dependent on a change from a first set of test data to a second set of test data within a time period controllable independent of the test clock frequency for the structural test.

10. An integrated circuit according to claim 9 wherein said logic circuitry comprises first and second logic gates for outputting respectively control signals for implementing a structural and a performance test, said state indicator being operable to select the appropriate one of said first and second sets of logic gate.

11. An integrated circuit according to claim 10 which comprises a multiplexor connected to the outputs of said first and second logic gates, said state indicator providing a signal to control switching of the multiplexor to provide outputs appropriate to the selected test mode.

12. A test system for an integrated circuit, the test system comprising:

a chain of scan latches implemented on said integrated circuit;

logic circuitry for generating a plurality of control signals to said scan latches;

a data output for outputting test data to said scan latches;

a data input for receiving resultant data from said scan latches, so that said resultant data can be compared with expected data;

a signal generator including a test clock for implementing a structural test at a predetermined frequency and for outputting timing signals to said scan latches a state indicator connected to said logic circuitry and to said generator for selecting a mode of operation of said controller from a first mode of structural test which provides resultant data dependent on a predetermined extant set of test data and a second mode of performance test which provides resultant data dependent on a change from a first set of test data to a second set of test data within a time period controllable independent of the test clock frequency for the structural test.

* * * * *